(12) United States Patent
Kwon et al.

(10) Patent No.: US 9,859,263 B2
(45) Date of Patent: Jan. 2, 2018

(54) SEMICONDUCTOR PACKAGE

(71) Applicant: SAMSUNG ELECTRONICS CO., LTD., Suwon-si, Gyeonggi-do (KR)

(72) Inventors: Seok-hong Kwon, Hwaseong-si (KR); Sang-nam Jeong, Hwaseong-si (KR); Sun-won Kang, Seongnam-si (KR); Hee-jin Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/239,020

(22) Filed: Aug. 17, 2016

(65) Prior Publication Data

US 2017/0125393 A1   May 4, 2017

(30) Foreign Application Priority Data

Oct. 30, 2015   (KR) .................. 10-2015-0152541

(51) Int. Cl.
   *H01L 25/18*   (2006.01)
   *H01L 23/31*   (2006.01)
   (Continued)

(52) U.S. Cl.
   CPC .......... *H01L 25/18* (2013.01); *H01L 23/3128* (2013.01); *H01L 23/49838* (2013.01);
   (Continued)

(58) Field of Classification Search
   CPC ..... H01L 25/18; H01L 24/17; H01L 25/0655; H01L 24/73; H01L 23/49838;
   (Continued)

(56) References Cited

U.S. PATENT DOCUMENTS 5,723,906 A * 3/1998 Rush ............... H01L 24/06
                                          257/203
6,359,340 B1 * 3/2002 Lin .................. H01L 25/0657
                                          257/723
(Continued)

FOREIGN PATENT DOCUMENTS

KR   2003-0009627 A    2/2003
KR   10-2005-0063052 A  6/2005
(Continued)

*Primary Examiner* — William Coleman
(74) *Attorney, Agent, or Firm* — Lee & Morse, P.C.

(57) ABSTRACT

A semiconductor package includes a package base substrate including bonding pads and a connection pads respectively on an upper surface and a lower surface of the package base substrate, four semiconductor chips attached onto the package base substrate, including a 1A semiconductor chip, a 1B semiconductor chip, a 2A semiconductor chip, and a 2B semiconductor chip, and each including a plurality of chip pads that are adjacent to a first edge of an upper surface of each of the 1A semiconductor chip, the 1B semiconductor chip, the 2A semiconductor chip, and the 2B semiconductor chip, and a bonding wire electrically connecting the chip pad and the bonding pad to each other, wherein the four semiconductor chips are disposed on the package base substrate such that first edges of the four semiconductor chips respectively face edges of the package base substrate that are different from each other.

14 Claims, 20 Drawing Sheets

(51) Int. Cl.
*H01L 23/498* (2006.01)
*H01L 23/00* (2006.01)
*H01L 25/065* (2006.01)

(52) U.S. Cl.
CPC .............. *H01L 24/17* (2013.01); *H01L 24/32* (2013.01); *H01L 24/49* (2013.01); *H01L 24/73* (2013.01); *H01L 25/0652* (2013.01); *H01L 25/0655* (2013.01); H01L 2224/16227 (2013.01); H01L 2224/2919 (2013.01); H01L 2224/32225 (2013.01); H01L 2224/48091 (2013.01); H01L 2224/48106 (2013.01); H01L 2224/48227 (2013.01); H01L 2224/49175 (2013.01); H01L 2224/73204 (2013.01); H01L 2224/73265 (2013.01); H01L 2225/0651 (2013.01); H01L 2225/0652 (2013.01); H01L 2225/06517 (2013.01); H01L 2225/06572 (2013.01); H01L 2924/1434 (2013.01); H01L 2924/15747 (2013.01)

(58) Field of Classification Search
CPC ..... H01L 25/0652; H01L 24/49; H01L 24/32; H01L 23/3128
See application file for complete search history.

(56) References Cited

U.S. PATENT DOCUMENTS

| | | | |
|---|---|---|---|
| 6,650,008 B2 | 11/2003 | Tsai et al. | |
| 6,900,528 B2* | 5/2005 | Mess | H01L 23/3128 257/686 |
| 6,924,496 B2* | 8/2005 | Manansala | G06K 9/00053 250/239 |
| 8,202,764 B2* | 6/2012 | Jeong | H01L 24/06 257/E23.011 |
| 8,549,217 B2* | 10/2013 | Blackmon | G11C 11/40611 711/105 |
| 8,803,336 B2 | 8/2014 | Lee et al. | |
| 8,823,165 B2* | 9/2014 | Haba | H01L 23/481 257/678 |
| 8,890,327 B2 | 11/2014 | Mohammed et al. | |
| 9,013,033 B2 | 4/2015 | Haba et al. | |
| 9,065,722 B2* | 6/2015 | Thottethodi | H04L 45/021 |
| 2003/0183917 A1 | 10/2003 | Tsai et al. | |
| 2006/0087013 A1* | 4/2006 | Hsieh | H01L 25/0652 257/678 |
| 2010/0032820 A1* | 2/2010 | Bruennert | H01L 23/481 257/686 |
| 2013/0009308 A1* | 1/2013 | Kwon | H01L 23/3128 257/738 |
| 2013/0099373 A1* | 4/2013 | Kwon | H01L 23/49811 257/737 |
| 2014/0103516 A1 | 4/2014 | Yeom | |
| 2014/0124921 A1* | 5/2014 | Lee | H01L 25/0652 257/737 |
| 2014/0145331 A1 | 5/2014 | Hwang et al. | |
| 2014/0242754 A1 | 8/2014 | Lee et al. | |

FOREIGN PATENT DOCUMENTS

| | | |
|---|---|---|
| KR | 10-2008-0061604 A | 7/2008 |
| KR | 10-2014-0056875 A | 5/2014 |
| KR | 10-2014-0067727 A | 6/2014 |

\* cited by examiner

SEMICONDUCTOR PACKAGE

CROSS-REFERENCE TO RELATED APPLICATION

Korean Patent Application No. 10-2015-0152541, filed on Oct. 30, 2015, in the Korean Intellectual Property Office, and entitled: "Semiconductor Package," is incorporated by reference herein in its entirety.

BACKGROUND

1. Field

Embodiments relate to a semiconductor package, and more particularly, to a semiconductor package including a plurality of semiconductor chips on a package base substrate.

2. Description of the Related Art

Electronic devices have had smaller sizes, lighter weight, and higher capacity due to rapid development of electronics industry and user demand. Accordingly, semiconductor packages included in the electronic devices having smaller sizes, lighter weight, and higher capacity are desirable.

Particularly, mobile devices are required to have higher performance and larger screens and also required to be thinner and lighter in order to maintain/improve portability.

SUMMARY

Embodiments are directed to a semiconductor package including a package base substrate including bonding pads and a connection pads respectively on an upper surface and a lower surface of the package base substrate, four semiconductor chips attached onto the package base substrate, including a 1A semiconductor chip, a 1B semiconductor chip, a 2A semiconductor chip, and a 2B semiconductor chip, and each including a plurality of chip pads that are adjacent to a first edge of an upper surface of each of the 1A semiconductor chip, the 1B semiconductor chip, the 2A semiconductor chip, and the 2B semiconductor chip, and a bonding wire electrically connecting the chip pad and the bonding pad to each other, wherein the four semiconductor chips are disposed on the package base substrate such that first edges of the four semiconductor chips respectively face edges of the package base substrate that are different from each other.

The 1A semiconductor chip and the 1B semiconductor chip may be disposed on the package base substrate such that first edges of the 1A semiconductor chip and the 1B semiconductor chip respectively face edges of the package base substrate that face each other.

The 1A semiconductor chip and the 1B semiconductor chip may be disposed on the package base substrate such that the first edges of the 1A semiconductor chip and the 1B semiconductor chip are respectively adjacent to the edges of the package base substrate that face each other.

The 2A semiconductor chip and the 2B semiconductor chip may be disposed on the package base substrate such that first edges of the 2A semiconductor chip and the 2B semiconductor chip are respectively adjacent to edges of the package base substrate that face each other.

The four semiconductor chips may be disposed on the package base substrate such that second edges opposite to first edges of the four semiconductor chips are respectively adjacent to edges of the package base substrate that are different from each other.

The semiconductor package may further include a first matching wire connecting the 1A semiconductor chip and the 1B semiconductor chip to each other and a second matching wire connecting the 2A semiconductor chip and the 2B semiconductor chip to each other. A first semiconductor chip including the 1A semiconductor chip and the 1B semiconductor chip and a second semiconductor chip including the 2A semiconductor chip and the 2B semiconductor chip serve as one semiconductor chip due to the first matching wiring and the second matching wiring, respectively.

Each of the first matching wiring and the second matching wiring may be an internal wiring in the package base substrate.

The first matching wiring and the second matching wiring may extend at the same level as each other in the package base substrate and may not cross each other.

The first matching wiring and the second matching wiring may extend at different levels from each other in the package base substrate and may cross each other in a vertical direction with respect to a main surface of the package base substrate.

The first matching wiring may be an internal wiring in the package base substrate, and the second matching wiring may be a connection bonding wire extending onto the package base substrate.

At least one selected from the chip pads of each of the 1A semiconductor chip and the 1B semiconductor chip may be electrically connected to the first matching wiring, and the others are electrically connected to the connection pads, and at least one selected from the chip pads of each of the 2A semiconductor chip and the 2B semiconductor chip may be electrically connected to the second matching wiring, and the others may be electrically connected to the connection pads.

Embodiments are also directed to a semiconductor package, including a package base substrate including a plurality of bonding pads and a plurality of connection pads respectively on an upper surface and a lower surface of the package base substrate, a first matching wiring and a second matching wiring in the package base substrate, and four edges, four semiconductor chips including a 1A semiconductor chip and a 1B semiconductor chip that are electrically connected to each other via the first matching wiring and a 2A semiconductor chip and a 2B semiconductor chip that are electrically connected to each other via the second matching wiring, each including a plurality of chip pads that are adjacent to a first edge of an upper surface of each of the 1A semiconductor chip, the 1B semiconductor chip, the 2A semiconductor chip, and the 2B semiconductor chip, and attached on the upper surface of the package base substrate, a bonding wire electrically connecting each of the chip pads and each of the bonding pads to each other, and a connector attached on each of the connection pads. The four semiconductor chips including the 1A semiconductor chip, the 1B semiconductor chip, the 2A semiconductor chip, and the 2B semiconductor chip may be disposed on the package base substrate such that first edges of the four semiconductor chips respectively face the four edges of the package base substrate different from each other.

The first matching wiring and the second matching wiring may be electrically insulated from the connection pads in the package base substrate, at least one selected from the chip pads of each of the 1A semiconductor chip and the 1B semiconductor chip may be electrically connected to the first matching wiring, and the others may be electrically connected to the connection pads, respectively, and at least one selected from the chip pads of each of the 2A semiconductor chip and the 2B semiconductor chip may be electrically connected to the second matching wiring, and the others may be electrically connected to the connection pads, respectively.

The semiconductor package may further include a main package base substrate, a main semiconductor chip attached onto the main package base substrate, and a main external connector attached onto a lower surface of the main package base substrate. The connector may be connected to an upper surface of the main package base substrate, such that the package base substrate on which the four semiconductor chips are attached is attached on the main package base substrate on which the main semiconductor chip are attached to have a package-on-package (PoP) structure.

The four semiconductor chips may be memory semiconductor chips, and the main semiconductor chip may be a processor unit.

Embodiments are also directed to a semiconductor device, including a substrate, the substrate having first, second, third, and fourth sides, the second side joining the first and third sides of the substrate, the fourth side being opposite the second side and joining the first and third sides of the substrate, and discrete first, second, third, and fourth dies mounted on the substrate, each of the first through fourth dies having a array of wire bonded pads arranged at a first side of the die, the array of wire bonded pads of each of the first through fourth dies providing identical functionally to the arrays of wire bonded pads of the others of the first through fourth dies. The arrays of wire bonded pads of each of the first through fourth dies may face a different one of the first through fourth sides of the substrate.

The arrays of wire bonded pads of the first and third dies face may away from each other, and a non-power pad of the array of wire bonded pads of the first die may be electrically connected to a non-power pad of the array of wire bonded pads of the third die.

The arrays of wire bonded pads of the first and third dies may face towards each other, and a non-power pad of the array of wire bonded pads of the first die may be electrically connected to a non-power pad of the array of wire bonded pads of the third die.

Each of the first through fourth dies may be identical to others of the first through fourth dies.

Each of the first though fourth dies may be a memory, the first and third dies may be electrically connected so as to provide first and second memory banks, the first die providing one of the first memory bank or the second memory bank, and the third die providing the other of the first memory bank or the second memory bank.

BRIEF DESCRIPTION OF THE DRAWINGS

Features will become apparent to those of skill in the art by describing in detail example embodiments with reference to the attached drawings in which.

DETAILED DESCRIPTION

Figure 1:
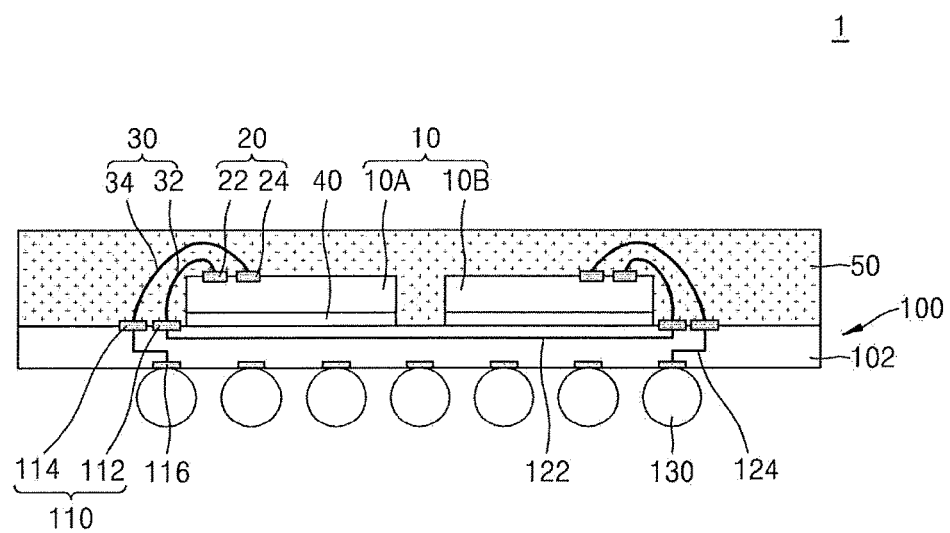
FIG. 1 illustrates a cross-sectional view of a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

In the drawings, lengths and sizes of components may be exaggerated for convenience of explanation, and a ratio between the sizes of components may be enlarged or reduced.

It will be understood that when a component is referred to as being "on" another component or as "contacting" another component, the component can be directly on or directly contact another component or intervening components may be present. In contrast, when a component is referred to as being "directly on" another component or "directly contacting" another element, there are no intervening components present. Other expressions describing relationships between components, such as, "between" and "directly between", will also be similarly understood.

While such terms as "first", "second", etc., may be used to describe various components, such components should not be limited to the above terms. The above terms are used only to distinguish one component from another. For example, a first component discussed below could be termed a second component, and similarly, a second component may be termed a first component, without departing from the teachings of this disclosure.

An expression used in the singular form encompasses the expression in the plural form, unless it has a clearly different meaning in the context. In the present specification, it is to be understood that the terms such as "including" or "having", etc., are intended to indicate the existence of the features, numbers, steps, actions, components, parts, or combinations thereof disclosed in the specification and are not intended to preclude the possibility that one or more other features, numbers, steps, actions, components, parts, or combinations thereof may be added.

As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms used herein have the same meaning as commonly understood by one of ordinary skill in the art.

FIG. 1 is a cross-sectional view of a semiconductor package 1 according to an embodiment.

Figure 2A:
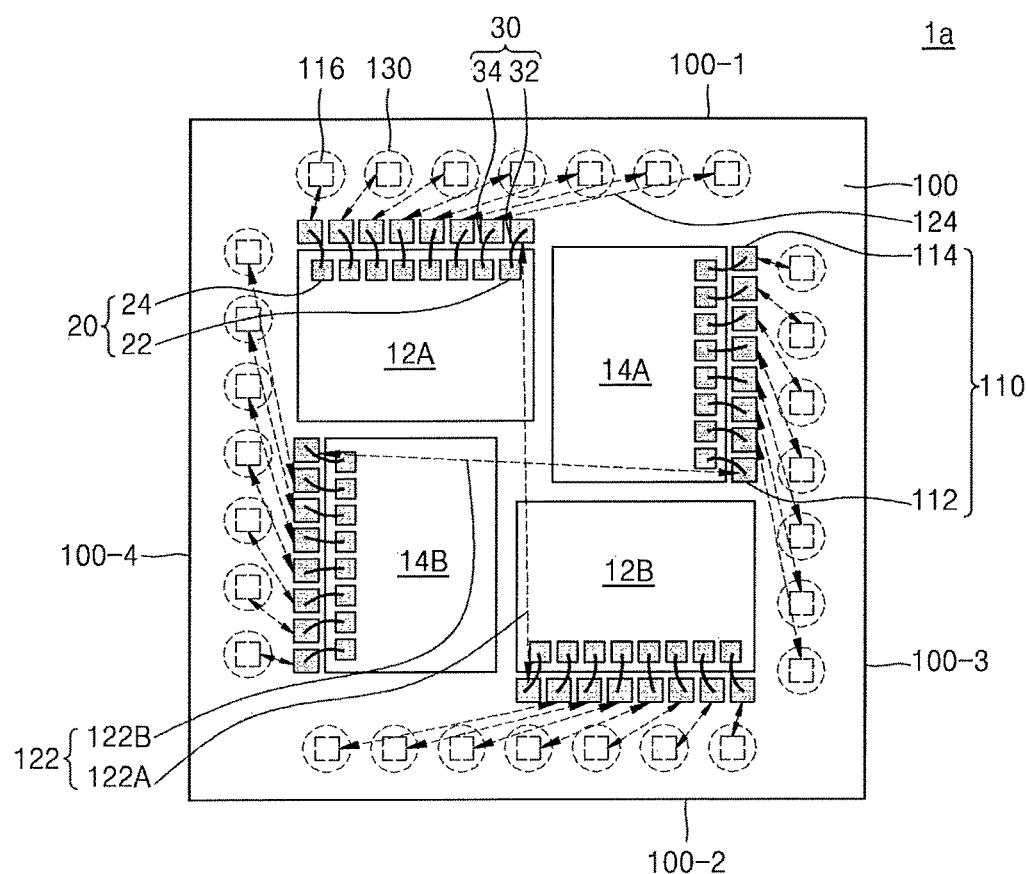
FIGS. 2A to 2C illustrate plan views of a semiconductor package according to an embodiment.
Figure 2B:
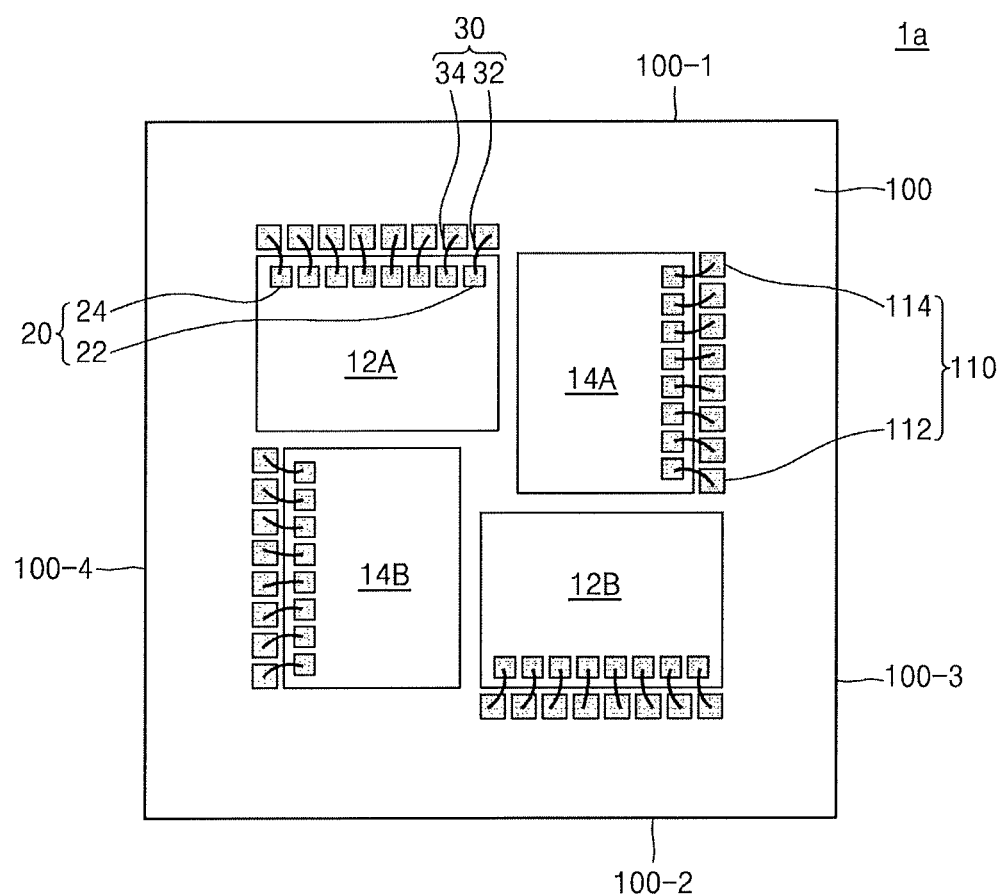

Referring to FIG. 1, the semiconductor package 1 includes a package base substrate 100 and a semiconductor die or chip 10. The semiconductor chip 10 may have a semiconductor chip A 10A and a semiconductor chip B 10B paired together. As illustrated in FIGS. 2A and 2B and other drawings, the semiconductor package 1 may include two pairs of semiconductor chips, that is, four semiconductor chips (12A, 12B, 14A, and 14B of FIG. 2A), and FIG. 1 illustrates a cross-section of the semiconductor chips 10A and 10B corresponding to one of two pairs of semiconductor chips 12A/12B and 14A/14B.

The package base substrate 100 may be, for example, a printed circuit board (PCB), a ceramic substrate, an interposer, etc.

When the package base substrate 100 is a PCB, the package base substrate 100 may include a substrate base 102, and a bonding pad 110 and a connection pad 116 respectively on an upper surface and a lower surface of the substrate base 102. The bonding pad 110 and the connection pad 116 may be respectively exposed via solder resist layers (not shown) respectively covering the upper surface and the lower surface of the substrate base 102. The substrate base 102 may include, for example, one or more materials such as phenol resin, epoxy resin, polyimide, etc. For example, the substrate base 102 may include one or materials such as FR4 (glass epoxy), tetrafunctional epoxy, polyphenylene ether, epoxy/polyphenylene oxide, bismaleimide triazine (BT), thermount, cyanate ester, polyimide, liquid crystal polymer, etc. The bonding pad 110 and the connection pad 116 may include, for example, copper (Cu), nickel, stainless steel, or beryllium Cu. Internal wirings 122 and 124 that electrically connect bonding pads 110 and/or the bonding pad 110 and the connection pad 116 to each other may be formed in the substrate base 102.

Although the internal wirings 122 and 124 are shown in FIG. 1 as being formed in the substrate base 102, the internal wirings 122 and 124 may be, for example, formed on the upper surface and/or the lower surface of the substrate base 102 and covered by the solder resist layers. The bonding pad 110 and the connection pad 116 may be portions of circuit wirings that are respectively exposed via the solder resist layers, the circuit wirings formed by, for example, coating the upper surface and the lower surface of the substrate base 102 with a Cu foil and then patterning the Cu foil.

When the package base substrate 100 is an interposer, the substrate base 102 may be formed by using, for example, a silicon wafer.

A connector 130 may be attached onto a lower surface of the package base substrate 100. The connector 130 may be attached onto, for example, the connection pad 116. The connector 130 may be, for example, a solder ball or bump. The connector 130 may electrically connect the semiconductor package 1 and an external device to each other.

The semiconductor chip 10 may have the semiconductor chip A 10A and the semiconductor chip B 10B paired together. The semiconductor chip A 10A and the semiconductor chip B 10B may be semiconductor chips of the same type that are manufactured through the same manufacturing process. Although the semiconductor chip A 10A and the semiconductor chip B 10B are separate as two semiconductor chips, the semiconductor chip A 10A and the semiconductor chip B 10B may serve as one semiconductor chip defined by the standard such as JEDEC Standard, and this will be described in detail below with reference to FIG. 7.

A semiconductor substrate used to form the semiconductor chip 10 may include, for example, silicon (Si). In an implementation, the semiconductor substrate used to form the semiconductor chip 10 may include a semiconductor element, such as germanium (Ge), or a compound semiconductor, such as Si carbide (SiC), gallium arsenide (GaAs), indium arsenide (InAs), and indium phosphide (InP). In an implementation, the semiconductor substrate used to form the semiconductor chip 10 may have a silicon-on-insulator (SOI) structure. For example, the semiconductor substrate used to form the semiconductor chip 10 may include a buried oxide (BOX) layer. The semiconductor substrate used to form the semiconductor chip 10 may include a conductive region, for example, an impurity-doped well. The semiconductor substrate used to form the semiconductor chip 10 may have various isolation structures, such as a shallow trench isolation (STI) structure.

The semiconductor chip 10 may include a semiconductor device including various types of individual devices. The individual devices may include various microelectronic devices, for example, a metal-oxide-semiconductor field effect transistor (MOSFET) (e.g., a complementary metal-oxide-semiconductor (CMOS) transistor), a system large scale integration (LSI) device, an image sensor (e.g., a CMOS imaging sensor (CIS)), a micro-electro-mechanical system (MEMS) component, an active device, a passive device, etc. The individual devices may be electrically connected to the conductive region of the semiconductor substrate used to form the semiconductor chip 10. The semiconductor device may further include a conductive wiring or a conductive plug that electrically connects at least two of the individual devices to each other or electrically connects the individual devices to the conductive region of the semiconductor substrate used to form the semiconductor chip 10. The individual devices may be electrically separated from other neighboring individual devices by insulation layers, respectively.

The semiconductor chip 10 may be, for example, a memory semiconductor chip. The memory semiconductor chip may be, for example, a volatile memory semiconductor chip, such as dynamic random access memory (DRAM) or static random access memory (SRAM), or a non-volatile memory semiconductor chip, such as NAND or NOR flash memory, phase-change random access memory (PRAM), magnetoresistive random access memory (MRAM), ferroelectric random access memory (FeRAM), or resistive random access memory (RRAM).

The semiconductor chip 10 may have a plurality of chip pads 20 that are adjacent to an edge (hereinafter referred to as a first edge) of the top surface of the semiconductor chip 10. The chip pads 20 may be electrically connected to a plurality of bonding pads 110 of the package base substrate 100 via bonding wires 30, respectively.

A chip pad 20 may include a first chip pad 22 and a second chip pad 24. For example, at least one of the chip pads 20 may be the first chip pad 22, and the other may be the second chip pad 24. The bonding pad 110 may include a first bonding pad 112 and a second bonding pad 114. For example, at least one of the bonding pads 110 may be the first bonding pad 112, and the other may be the second bonding pad 114.

A bonding wire 30 may include a first bonding wire 32, which connects the first chip pad 22 and the first bonding pad 112 to each other, and a second bonding wire 34, which connects the second chip pad 24 and the second bonding pad 114 to each other.

The internal wirings 122 and 124 disposed in the package base substrate 100 may include a first internal wiring 122 and a second internal wiring 124. The first internal wiring 122 may connect first bonding pads 112 to each other. The second internal wiring 124 may connect the second bonding pad 114 and the connection pad 116.

For example, the first internal wiring 122 may connect the first bonding pads 112 (which are connected to first chip pads 22 of the semiconductor chip A 10A and the semiconductor chip B 10B via first bonding wires 32, respectively) to each other. Thus, the first chip pad 22 of the semiconductor chip A 10A and the first chip pad 22 of the semiconductor chip B 10B may be electrically connected to each other via the first internal wiring 122.

The semiconductor chip A 10A and the semiconductor chip B 10B may be connected to each other via the first internal wiring 122 so as to serve as one semiconductor chip, as described above. When the semiconductor chip 10 has two pairs of semiconductor chips, first internal wirings 122 that electrically connect the pairs of semiconductor chips, respectively, to each other may be separately disposed in the package base substrate 100.

Each of the semiconductor chip A 10A and the semiconductor chip B 10B may be connected to the second chip pad 24, the second bonding wire 34, the second bonding pad 114, the second internal wiring 124, the connection pad 116, and the connector 130 and thus may be electrically connected to an external device.

The semiconductor package 1 may further include a molding layer 50 disposed on the package base substrate 100 and covering an upper surface of the package base substrate 100, the semiconductor chip 10, and the bonding wire 30. The molding layer 50 may include, for example, an epoxy molding compound (EMC).

In an implementation, first edges of a pair of semiconductor chips 10 (for example, the semiconductor chip A 10A and the semiconductor chip B 10B) may face opposite directions to each other or face each other. Thus, the semiconductor chip A 10A and the semiconductor chip B 10B may have edges opposite to the first edges (hereinafter referred to as second edges) facing each other, or may have the first edges facing each other.

The semiconductor chip 10 may be attached onto the package base substrate 100 such that an active surface of the semiconductor chip 10 faces opposite from the package base substrate 100. For example, an inactive surface of the semiconductor chip 10 may face the package base substrate 100.

The semiconductor chip 10 may be attached onto the package base substrate 100 by, for example, a die-bonding film 40. The die-bonding film 40 may include a binder element and a curing element. The binder element may include, for example, acrylic polymer and/or epoxy resin. The curing element may include, for example, epoxy resin, phenol-based curable resin, or phenoxy resin. In an implementation, the curing element may serve as the binder element as well. The die-bonding film 40 may further include an additive, such as a curing agent or a silane coupling agent, and a sealant. The curing agent may be, for example, a phosphine-based curing agent, an imidazole-based curing agent, or an amine-based curing agent. The silane coupling agent may be, for example, a mercapto silane coupling agent or an epoxy silane coupling agent. The sealant may be, for example, silica.

Figure 2C:
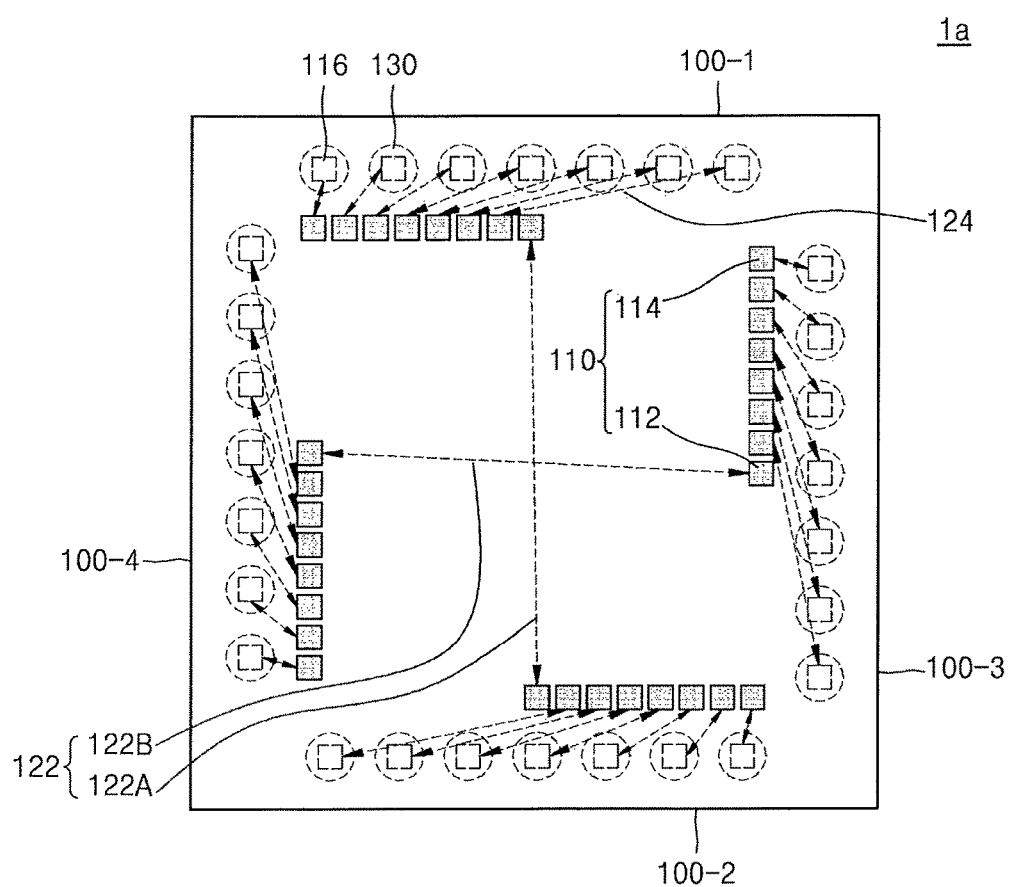

FIGS. 2A to 2C are plan views of a semiconductor package 1a according to an embodiment. Each of FIGS. 2B and 2C is a plan view selectively illustrating some elements of FIG. 2A. FIG. 2B is a plan view illustrating an example arrangement of semiconductor chips included in the semiconductor package, and FIG. 2C is a plan view illustrating a bonding pad of a package base substrate included in the semiconductor package and connection relationship between a connector attached to the package base substrate and the bonding pad. In further detail, FIG. 2B is a plan view illustrating an example arrangement of semiconductor chips 12A, 12B, 14A, and 14B included in the semiconductor package 1a, and FIG. 2C is a plan view illustrating the bonding pad 110 of the package base substrate 100 included in the semiconductor package 1a and connection relationship between the connector 130 attached to the package base substrate 100 and the bonding pad 110. A description that has been made with reference to FIG. 1 may be omitted.

Referring to FIGS. 2A to 2C together, the semiconductor package 1a includes the package base substrate 100 and the semiconductor chips 12A, 12B, 14A, and 14B. For example, the package base substrate 100 may be a monolithic substrate, and the semiconductor chips 12A, 12B, 14A, and 14B may each be discrete dies. The semiconductor chips 12A, 12B, 14A, and 14B may have first semiconductor chips 12A and 12B paired together, and second semiconductor chips 14A and 14B paired together. Thus, the first semiconductor chips 12A and 12B may have a 1A semiconductor chip 12A and a 1B semiconductor chip 12B paired together, and the second semiconductor chips 14A and 14B may have a 2A semiconductor chip 14A and a 2B semiconductor chip 14B paired together.

The 1A semiconductor chip 12A and the 1B semiconductor chip 12B or the 2A semiconductor chip 14A and the 2B semiconductor chip 14B correspond to the semiconductor chip A 10A and the semiconductor chip B 10B of FIG. 1, and thus, a detailed description thereof will be omitted.

Each of the semiconductor chips 12A, 12B, 14A, and 14B may have the chip pads 20 that are adjacent to an edge (for example, the first edge) of the top surface (which is the active surface) of each of the semiconductor chips 12A, 12B, 14A, and 14B.

The package base substrate 100 may include the bonding pad 110 and the connection pad 116 respectively on the upper surface and the lower surface of the package base substrate 100. The connector 130 may be attached onto the connection pad 116 on the lower surface of the package base substrate 100.

The bonding wire 30 may electrically connect the chip pad 20 and the bonding pad 110 that correspond to each other to each other.

The semiconductor chips 12A, 12B, 14A, and 14B may be semiconductor chips of the same type that are manufactured through the same manufacturing process. Although each of the 1A and 1B semiconductor chips 12A and 12B and the 2A and 2B semiconductor chips 14A and 14B is separate as two semiconductor chips, each may serve as one semiconductor chip defined by the standard such as JEDEC Standard. Thus, the semiconductor package 1a may include the first semiconductor chips 12A and 12B and the second semiconductor chips 14A and 14B that serve as two semiconductor chips.

The semiconductor chips 12A, 12B, 14A, and 14B may be, for example, memory semiconductor chips. The memory semiconductor chips may be, for example, volatile memory semiconductor chips, such as DRAM or SRAM, or non-volatile memory semiconductor chips, such as such as NAND or NOR flash memory, PRAM, MRAM, FeRAM, or RRAM. In some embodiments, the first semiconductor chips 12A and 12B and the second semiconductor chips 14A and 14B may each be DRAM that satisfies the standard of low power double data rate 4 (LPDDR4) or higher.

The chip pad 20 may include the first chip pad 22 and the second chip pad 24. For example, at least one of the chip pads 20 that one of the semiconductor chips 12A, 12B, 14A, and 14B has may be the first chip pad 22, and the other may be the second chip pad 24. The bonding pad 110 may include the first bonding pad 112 and the second bonding pad 114. For example, at least one of the bonding pads 110 electrically connected to the chip pads 20 that one of the semiconductor chips 12A, 12B, 14A, and 14B has may be the first bonding pad 112, and the other may be the second bonding pad 114.

The bonding wire 30 may include the first bonding wire 32 that connects the first chip pad 22 and the first bonding pad 112 and the second bonding wire 34 that connects the second chip pad 24 and the second bonding pad 114.

Although it is illustrated that the chip pads 20 are arranged in a row along the first edge, in other implementations the chip pads 20 may be arranged, for example, in two or more rows along the first edge, etc.

Although it is illustrated that the first chip pad 22 is at an end of the row formed by the chip pads 20, in other implementations the first chip pad 22 may be, for example, in the middle of the row formed by the chip pads 20.

The semiconductor chips 12A, 12B, 14A, and 14B may be disposed on the package base substrate 100 such that first edges of the semiconductor chips 12A, 12B, 14A, and 14B respectively face edges of the package base substrate 100 that are different from each other. For example, when the 1A semiconductor chip 12A, the 1B semiconductor chip 12B, the 2A semiconductor chip 14A, and the 2B semiconductor chip 14B are semiconductor chips of the same type, they may be disposed on the package base substrate 100 while rotated by 0 degree, 90 degrees, 180 degrees, and 270 degrees, respectively.

The semiconductor chips 12A, 12B, 14A, and 14B may be disposed on the package base substrate 100 such that the first edges of the semiconductor chips 12A, 12B, 14A, and 14B are respectively adjacent to edges of the package base substrate 100 that are different from each other.

The 1A semiconductor chip 12A and the 1B semiconductor chip 12B may be disposed on the package base substrate 100 such that the first edges of the 1A semiconductor chip 12A and the 1B semiconductor chip 12B respectively face edges of the package base substrate 100 that are opposite each other. The 2A semiconductor chip 14A and the 2B semiconductor chip 14B may be disposed on the package base substrate 100 such that the first edges of the 2A semiconductor chip 14A and the 2B semiconductor chip 14B respectively face edges of the package base substrate 100 that are opposite each other.

For example, when one edge of the package base substrate 100, for example, an edge that is opposite a first edge 100-1, is referred to as a second edge 100-2, and two edges that are connected to the first edge 100-1 and the second edge 100-2 and are opposite each other are respectively referred to as a third edge 100-3 and a fourth edge 100-4, the 1A semiconductor chip 12A and the 1B semiconductor chip 12B may be disposed on the package base substrate 100 such that the first edges of the 1A semiconductor chip 12A and the 1B semiconductor chip 12B face the first edge 100-1 and the second edge 100-2 of the package base substrate 100, respectively, and the 2A semiconductor chip 14A and the 2B semiconductor chip 14B may be disposed on the package base substrate 100 such that the first edges of the 2A semiconductor chip 14A and the 2B semiconductor chip 14B face the third edge 100-3 and the fourth edge 100-4 of the package base substrate 100, respectively.

The bonding pad 110 connected to the chip pad 20 of each of the semiconductor chips 12A, 12B, 14A, and 14B may be adjacent to the first edge of each of the semiconductor chips 12A, 12B, 14A, and 14B. In an implementation, each of the semiconductor chips 12A, 12B, 14A, and 14B may be identical to the others, and a same bonding pad 110 on each of the semiconductor chips 12A, 12B, 14A, and 14B may provide a same function.

The bonding pad 110 connected to the chip pad 20 of the 1A semiconductor chip 12A may be adjacent to the first edge 100-1 of the package base substrate 100. The bonding pad 110 connected to the chip pad 20 of the 1B semiconductor chip 12B may be adjacent to the second edge 100-2 of the package base substrate 100. The bonding pad 110 connected to the chip pad 20 of the 2A semiconductor chip 14A may be adjacent to the third edge 100-3 of the package base substrate 100. The bonding pad 110 connected to the chip pad 20 of the 2B semiconductor chip 14B may be adjacent to the fourth edge 100-4 of the package base substrate 100.

Accordingly, a loop path of the bonding wire 30 that connects the chip pad 20 and the bonding pad 110 to each other may be shortened.

The internal wirings 122 and 124 disposed in the package base substrate 100 may include the first internal wiring 122 and the second internal wiring 124. The internal wirings 122 and 124 may differ depending on circuit configuration of the semiconductor package 1a and a method of forming the package base substrate 100. Accordingly, the internal wirings 122 and 124 are denoted by arrows each connecting two elements, and this does not limit actual placement of the internal wirings 122 and 144.

The first internal wiring 122 may be connected to the first bonding pad 112 connected to the first chip pad 22 of each of the semiconductor chips 12A, 12B, 14A, and 14B via the first bonding wire 32. The first internal wiring 122 may include a 1A internal wiring 122A and a 1B internal wiring 122B. For example, the 1A internal wiring 122A may connect the first bonding pads 112 that are respectively connected to the first chip pads 22 of the 1A semiconductor chip 12A and the 1B semiconductor chip 12B via the first bonding wire 32 to each other, and the 1B internal wiring 122B may connect the first bonding pads 112 that are respectively connected to the first chip pads 22 of the 2A semiconductor chip 14A and the 2B semiconductor chip 14B via the first bonding wire 32 to each other.

The 1A semiconductor chip 12A and the 1B semiconductor chip 12B may be connected to each other via the 1A internal wiring 122A so as to serve as one semiconductor chip. The 2A semiconductor chip 14A and the 2B semiconductor chip 14B may be connected to each other via the 1B internal wiring 122B, which may provide a data signal, control signal, address signal, or other non-power voltage (including non-ground), so as to serve as one semiconductor chip.

For example, the second chip pad 24 may be a data (DQ) pad or a control/address (CA) pad of each of the semiconductor chips 12A, 12B, 14A, and 14B. For example, the first chip pad 22 may be a pad for matching ZQ calibration between the 1A semiconductor chip 12A and the 1B semiconductor chip 12B or between the 2A semiconductor chip 14A and the 2B semiconductor chip 14B. The ZQ calibration refers to calibrating output drive strength and termination resistance in order to decrease an impedance mismatch between a memory controller and a memory, and to obtain stability of signals. Thus, the 1A semiconductor chip 12A and the 1B semiconductor chip 12B or the 2A semiconductor chip 14A and the 2B semiconductor chip 14B may have ZQ calibration matched through the 1A internal wiring 122A or the 1B internal wiring 122B, and thus may serve as one semiconductor chip. The 1A internal wiring 122A or the 1B internal wiring 122B for matching ZQ calibration between the 1A semiconductor chip 12A and the 1B semiconductor chip 12B or between the 2A semiconductor chip 14A and the 2B semiconductor chip 14B may be referred to as a matching wiring.

The 1A internal wiring 122A and the 1B internal wiring 122B may extend separate from each other so as not to be connected to each other in the package base substrate 100. The 1A internal wiring 122A and the 1B internal wiring 122B may not be connected to the connector 130.

Accordingly, the 1A internal wiring 122A and the 1B internal wiring 122B may be electrically insulated from the connection pad 116 in the package base substrate 100. The 1A internal wiring 122A and the 1B internal wiring 122B may connect only the 1A semiconductor chip 12A and the 1B semiconductor chip 12B to each other and only the 2A semiconductor chip 14A and the 2B semiconductor chip 14B to each other.

Each of the 1A semiconductor chip 12A, the 1B semiconductor chip 12B, the 2A semiconductor chip 14A, and the 2B semiconductor chip 14B may be connected to the second chip pad 24, the second bonding wire 34, the second bonding pad 114, the second internal wiring 124, the connection pad 116, and the connector 130 and thus may be electrically connected to an external device.

The connector 130 electrically connected to the second chip pad 24 of each of the 1A semiconductor chip 12A, the 1B semiconductor chip 12B, the 2A semiconductor chip 14A, and the 2B semiconductor chip 14B may be adjacent to each of the first to fourth edges 100-1 to 100-4 of the semiconductor package substrate 100. Although it is illustrated that connectors 130 are arranged in a row along the first to fourth edges 100-1 to 100-4 of the semiconductor package substrate 100, in other implementations the connectors 130 may be arranged, for example, in two or more rows along the first to fourth edges 100-1 to 100-4 of the semiconductor package substrate 100.

Accordingly, a path of the second internal wiring 124 that connects the second bonding pad 114 and the connector 130 to each other may be shortened. Also, average paths of second internal wirings 124 that are electrically connected to the 1A semiconductor chip 12A, the 1B semiconductor chip 12B, the 2A semiconductor chip 14A, and the 2B semiconductor chip 14B, respectively, may be similar to each other.

When a semiconductor package includes two semiconductor chips, each of which is integrally formed as a whole, the two semiconductor chips have to be stacked on a package base substrate or have to be disposed side by side on the package base substrate. When the two semiconductor chips are stacked on a package base substrate, empty space may be formed under an upper semiconductor chip, and thus, defects may occur during a process of forming a bonding wire, and thickness of the semiconductor package may increase. When the two semiconductor chips are disposed side by side on the package base substrate, an internal wiring in the package base substrate may become complicated or may have increased length, thereby degrading characteristics of the semiconductor package.

However, a semiconductor package according to one or more embodiments may have thickness decreased and defects prevented during a process of forming a bonding wire by using a pair of semiconductor chips serving as one semiconductor chip. Also, an internal wiring in a package base substrate may become simpler or may have decreased length, and thus, there may be no degradation in characteristics of the semiconductor package. Accordingly, the semiconductor package may have increased reliability.

Figure 3A:
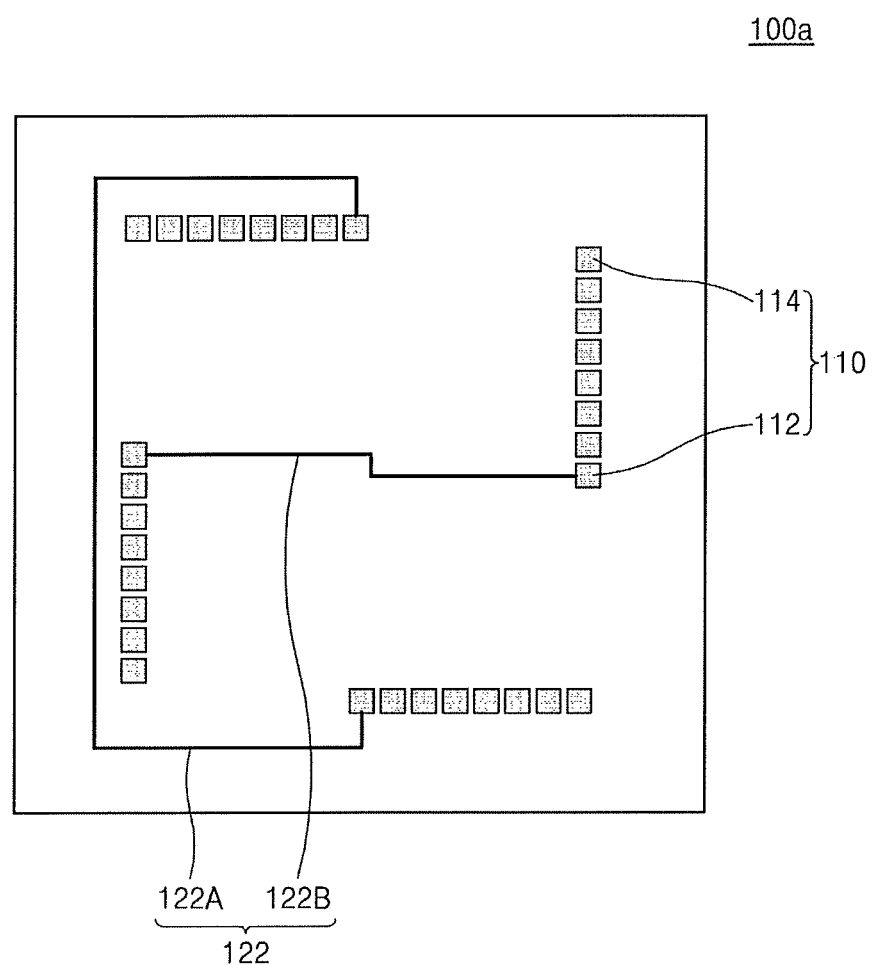
FIG. 3A illustrates a schematic plan view of connection relationship between first bonding pads of a package base substrate included in a semiconductor package according to an embodiment.

FIG. 3A is a schematic plan view of connection relationship between the first bonding pads 112 of a package base substrate 100a included in a semiconductor package according to an embodiment. A description of FIG. 3A that has been made with reference to FIGS. 1 to 2C may be omitted.

Referring to FIG. 3A, the package base substrate 100a may include, on an upper surface of the package base substrate 100a, the bonding pad 110 including the first bonding pad 112 and the second bonding pad 114. The 1A internal wiring 122A and the 1B internal wiring 122B that connect the first bonding pads 112 to each other may be at the same level as each other in the package base substrate 100a, that is, a substrate base (102 of FIG. 1). Accordingly, the 1A internal wiring 122A and the 1B internal wiring 122B may be disposed in the package base substrate 100a such that they extend bypassing each other at the same level as each other in the package base substrate 100a so as not to cross each other.

Figure 3B:
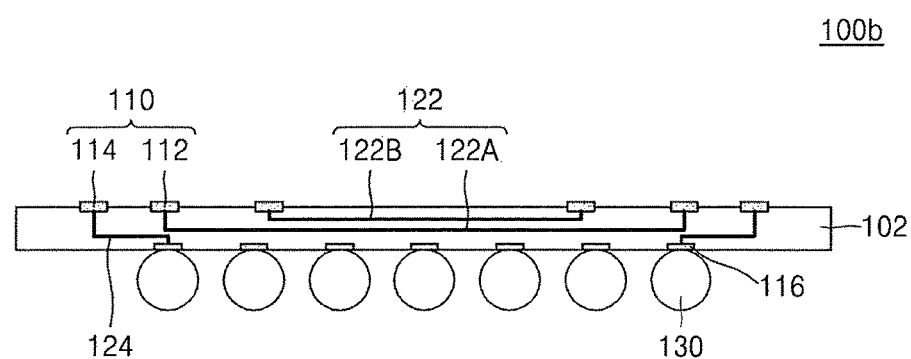
FIG. 3B illustrates a schematic cross-sectional view of connection relationship between first bonding pads of a package base substrate included in a semiconductor package according to an embodiment.

FIG. 3B is a schematic cross-sectional view of connection relationship between the first bonding pads 112 of a package base substrate 100b included in a semiconductor package according to an embodiment. A description of FIG. 3B that has been made with reference to FIGS. 1 to 2C may be omitted.

Referring to FIG. 3B, the package base substrate 100b may include the bonding pad 110 including the first bonding pad 112 and the second bonding pad 114 and the connection pad 116 respectively on an upper surface and a lower surface of the package base substrate 100b. The connector 130 may be attached to the connection pad 116. The connection pad 116 may be connected to the second bonding pad 114 via the second internal wiring 124.

The 1A internal wiring 122A and the 1B internal wiring 122E that connect the first bonding pads 112 to each other may extend at different levels from each other in the package base substrate 100b, that is, the substrate base 102. Accordingly, the 1A internal wiring 122A and the 1B internal wiring 122B may be disposed in the package base substrate 100b so as to cross each other in a vertical direction with respect to a main surface of the package base substrate 100b.

The internal wirings 122 and 124 may have a plurality of layers in the package base substrate 100b. In this regard, a layer refers to portions of the internal wirings 122 and 124 that are at the same level as each other from an upper surface or a lower surface of the substrate base 102. For example, when the internal wirings 122 and 124 are only on the upper surface and the lower surface of the substrate base 102, the internal wirings 122 and 124 have two layers. In an implementation, for example, when the substrate base 102 includes a plurality of base layers, and the internal wirings 122 and 124 are between the base layers as well, the internal wirings 122 and 124 have three or more layers.

When the 1A internal wiring 122A and the 1B internal wiring 122E are referred to as being at the same level as each other in the substrate base 102, it means that the 1A internal wiring 122A and the 1B internal wiring 122B are on one layer, and when the 1A internal wiring 122A and the 1B internal wiring 122B are referred to as being at different levels from each other, it means that the 1A internal wiring 122A and the 1B internal wiring 122B are on two layers different from each other. In this regard, when the 1A internal wiring 122A and the 1B internal wiring 122B are on a layer different from the first chip pad 22, a wiring that vertically connects the 1A internal wiring 122A and the 1B internal wiring 122B and the first chip pad 22 to each other may be further formed.

Thus, when a 1A internal wiring and a 1B internal wiring are referred to as crossing or not crossing each other in the present specification, it means that the 1A internal wiring and the 1B internal wiring cross or do not cross each other in a vertical direction with respect to a main surface of a package base substrate, that is, in view of plane arrangement.

Figure 4A:
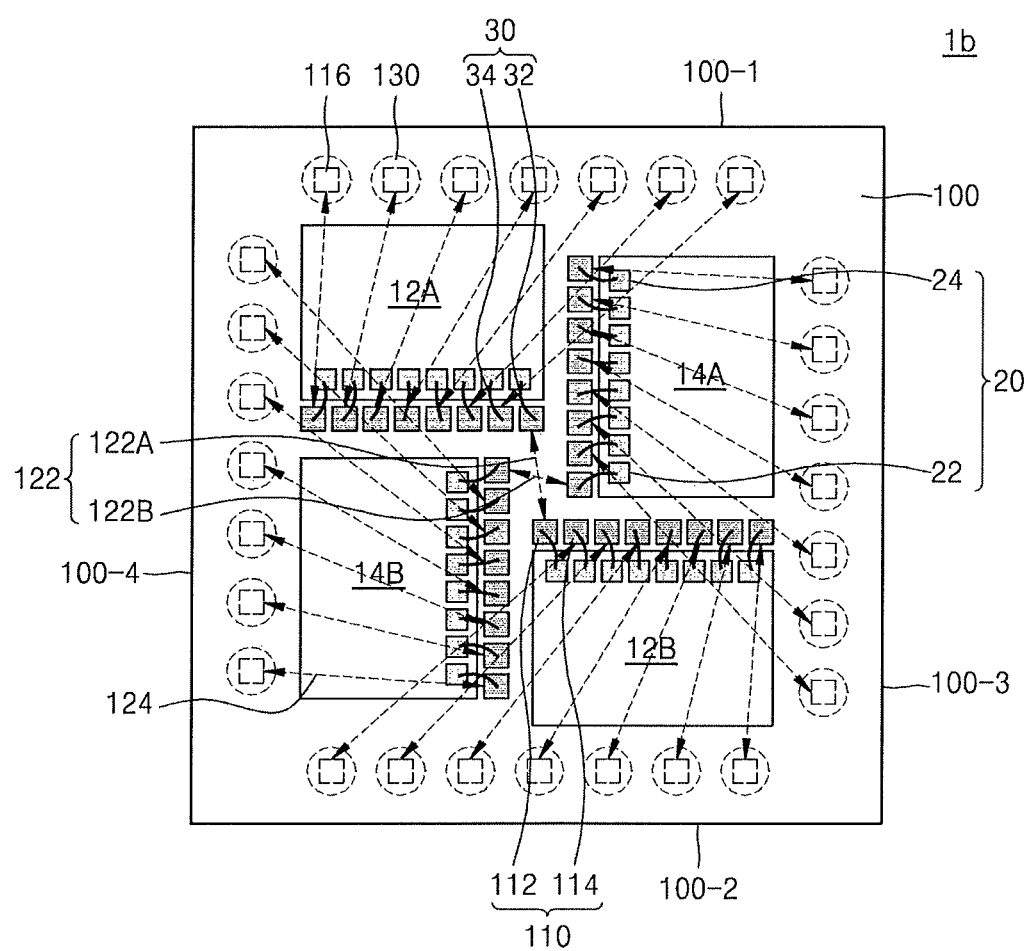
FIGS. 4A to 4C illustrate plan views of a semiconductor package according to an embodiment.
Figure 4B:
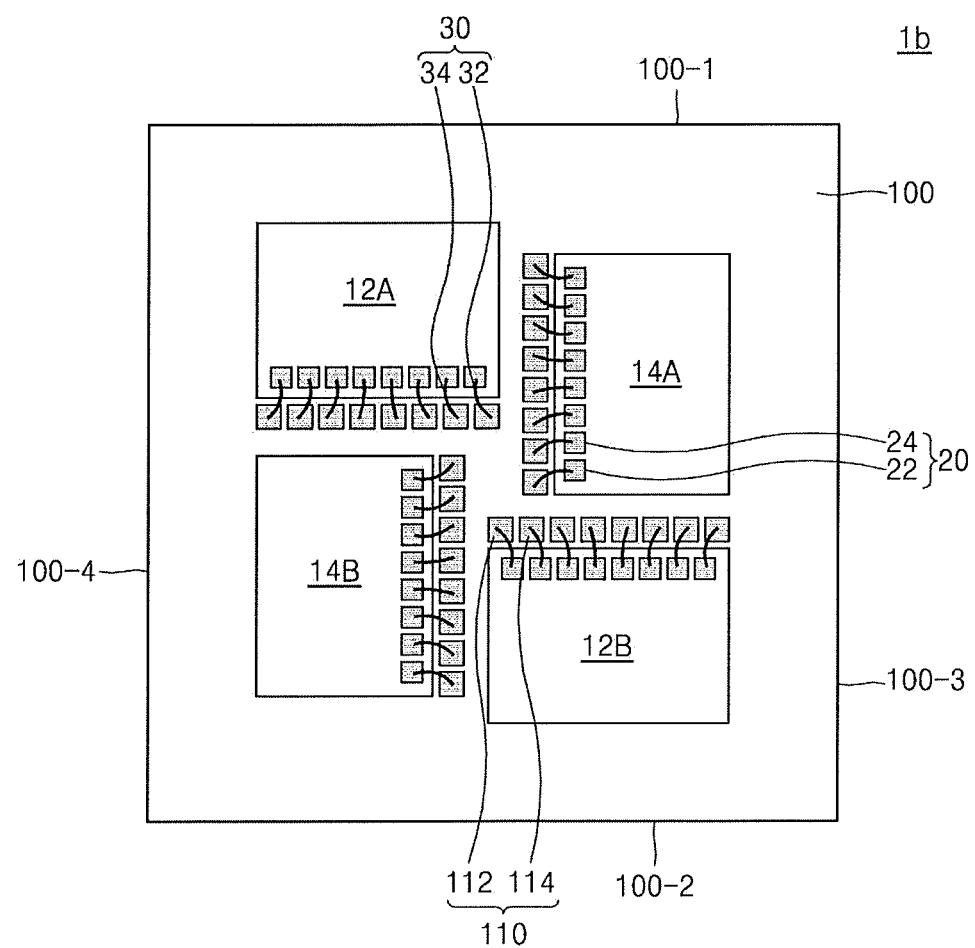
Figure 4C:
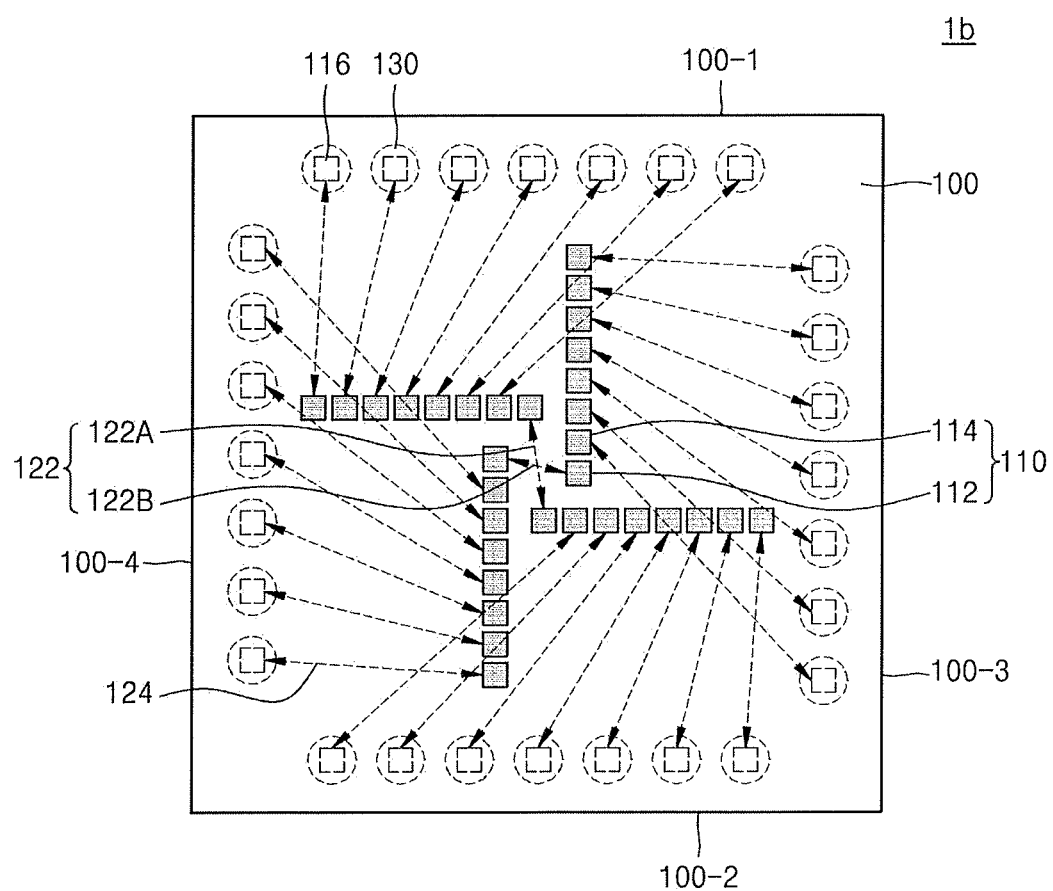

FIGS. 4A to 4C are plan views of a semiconductor package 1b according to an embodiment. FIG. 4B is a plan view illustrating arrangement of semiconductor chips included in the semiconductor package, and FIG. 4C is a plan view illustrating a bonding pad of a package base substrate included in the semiconductor package and connection relationship between a connector attached to the package base substrate and the bonding pad. In further detail, each of FIGS. 4B and 4C is a plan view selectively illustrating some elements of FIG. 4A. FIG. 4B is a plan view illustrating arrangement of the semiconductor chips 12A, 12B, 14A, and 14B included in the semiconductor package 1b, and FIG. 4C is a plan view illustrating the bonding pad 110 of the package base substrate 100 included in the semiconductor package 1b and connection relationship between the connector 130 attached to the package base substrate 100 and the bonding pad 110. A description that has been made with reference to FIGS. 1 to 3B may be omitted.

Referring to FIGS. 4A to 4C together, the semiconductor package 1b includes the package base substrate 100 and the semiconductor chips 12A, 12B, 14A, and 14B. The semiconductor chips 12A, 12B, 14A, and 14B may have the first semiconductor chips 12A and 12B paired together and the second semiconductor chips 14A and 14B paired together. Thus, the first semiconductor chips 12A and 12B may have the 1A semiconductor chip 12A and the 1B semiconductor chip 12B paired together, and the second semiconductor chips 14A and 14B may have the 2A semiconductor chip 14A and the 2B semiconductor chip 14B paired together. The semiconductor chips 12A, 12B, 14A, and 14B may be, for example, memory semiconductor chips.

Each of the semiconductor chips 12A, 12B, 14A, and 14B may have the chip pads 20 that are adjacent to an edge (for example, a first edge) of the top surface (which is an active surface) of each of the semiconductor chips 12A, 12B, 14A, and 14B.

The package base substrate 100 may include the bonding pad 110 and the connection pad 116 respectively on an upper surface and a lower surface of the package base substrate 100. The connector 130 may be attached onto the connection pad 116 on the lower surface of the package base substrate 100.

The bonding wire 30 may electrically connect the chip pad 20 and the bonding pad 110 that correspond to each other to each other.

The chip pad 20 may include the first chip pad 22 and the second chip pad 24. For example, at least one of the chip pads 20 that one of the semiconductor chips 12A, 12B, 14A, and 14B has may be the first chip pad 22, and the other may be the second chip pad 24. The bonding pad 110 may include the first bonding pad 112 and the second bonding pad 114. For example, at least one of the bonding pads 110 electrically connected to the chip pads 20 that one of the semiconductor chips 12A, 12B, 14A, and 14B has may be the first bonding pad 112, and the other may be the second bonding pad 114.

The bonding wire 30 may include the first bonding wire 32 that connects the first chip pad 22 and the first bonding pad 112 and the second bonding wire 34 that connects the second chip pad 24 and the second bonding pad 114.

Although it is illustrated that the chip pads 20 are arranged in a row along the first edge, in other implementations the chip pads 20 may be arranged, for example, in two or more rows along the first edge.

Although it is illustrated that the first chip pad 22 is at an end of the row formed by the chip pads 20, in other embodiments the first chip pad 22 may be, for example, in the middle of the row formed by the chip pads 20.

The semiconductor chips 12A, 12B, 14A, and 14B may be disposed on the package base substrate 100 such that first edges of the semiconductor chips 12A, 12B, 14A, and 14B respectively face edges of the package base substrate 100 that are different from each other. The semiconductor chips 12A, 12B, 14A, and 14B may be disposed on the package base substrate 100 such that second edges opposite the first edges of the semiconductor chips 12A, 12B, 14A, and 14B are respectively adjacent to edges of the package base substrate 100 that are different from each other.

The 1A semiconductor chip 12A and the 1B semiconductor chip 12B may be disposed on the package base substrate 100 such that the first edges of the 1A semiconductor chip 12A and the 1B semiconductor chip 12B respectively face edges of the package base substrate 100 that are opposite each other. The 2A semiconductor chip 14A and the 2B semiconductor chip 14B may be disposed on the package base substrate 100 such that the first edges of the 2A semiconductor chip 14A and the 2B semiconductor chip 14B respectively face edges of the package base substrate 100 that are opposite each other.

For example, the 1A semiconductor chip 12A and the 1B semiconductor chip 12B may be disposed on the package base substrate 100 such that the first edges of the 1A semiconductor chip 12A and the 1B semiconductor chip 12B face the second edge 100-2 and the first edge 100-1 of the package base substrate 100, respectively, and the 2A semiconductor chip 14A and the 2B semiconductor chip 14B may be disposed on the package base substrate 100 such that the first edges of the 2A semiconductor chip 14A and the 2B semiconductor chip 14B face the fourth edge 100-4 and the third edge 100-3 of the package base substrate 100, respectively.

The bonding pad 110 connected to the chip pad 20 of each of the semiconductor chips 12A, 12B, 14A, and 14B may be adjacent to the first edge of each of the semiconductor chips 12A, 12B, 14A, and 14B.

For example, the bonding pad 110 connected to the chip pad 20 of the 1A semiconductor chip 12A may be between the 1A semiconductor chip 12A and the 2B semiconductor chip 14B. The bonding pad 110 connected to the chip pad 20 of the 1B semiconductor chip 12B may be between the 1B semiconductor chip 12B and the 2A semiconductor chip 14A. The bonding pad 110 connected to the chip pad 20 of the 2A semiconductor chip 14A may be between the 2A semiconductor chip 14A and the 1A semiconductor chip 12A. The bonding pad 110 connected to the chip pad 20 of the 2B semiconductor chip 14B may be between the 2B semiconductor chip 14B and the 1B semiconductor chip 12B.

Accordingly, a loop path of the bonding wire 30 that connects the chip pad 20 and the bonding pad 110 to each other may be shortened.

The internal wirings 122 and 124 disposed in the package base substrate 100 may include the first internal wiring 122 and the second internal wiring 124.

The first internal wiring 122 may be connected to the first bonding pad 112 connected to the first chip pad 22 of each of the semiconductor chips 12A, 12B, 14A, and 14B via the first bonding wire 32. The first internal wiring 122 may include the 1A internal wiring 122A and the 1B internal wiring 122B. For example, the 1A internal wiring 122A may connect the first bonding pads 112 that are respectively connected to the first chip pads 22 of the 1A semiconductor chip 12A and the 1B semiconductor chip 12B via the first bonding wire 32 to each other, and the 1B internal wiring 122B may connect the first bonding pads 112 that are respectively connected to the first chip pads 22 of the 2A semiconductor chip 14A and the 2B semiconductor chip 14B via the first bonding wire 32 to each other.

The 1A semiconductor chip 12A and the 1B semiconductor chip 12B may be connected to each other via the 1A internal wiring 122A so as to serve as one semiconductor chip. Also, the 2A semiconductor chip 14A and the 2B semiconductor chip 14B may be connected to each other via the 1B internal wiring 122B so as to serve as one semiconductor chip.

For example, the second chip pad 24 may be a DQ pad or a CA pad of each of the semiconductor chips 12A, 12B, 14A, and 14B. For example, the first chip pad 22 may be a pad for matching ZQ calibration between the 1A semiconductor chip 12A and the 1B semiconductor chip 12B or between the 2A semiconductor chip 14A and the 2B semiconductor chip 14B. Thus, the 1A semiconductor chip 12A and the 1B semiconductor chip 12B or the 2A semiconductor chip 14A and the 2B semiconductor chip 14B may have ZQ calibration matched through the 1A internal wiring 122A or the 1B internal wiring 122B and thus may serve as one semiconductor chip.

The 1A internal wiring 122A and the 1B internal wiring 122B may be separate from each other in the package base substrate 100 and may not be connected to the connector 130, that is, the connection pad 116.

As illustrated in FIGS. 3A and 3B, the 1A internal wiring 122A and the 1B internal wiring 122B may be at the same level as each other or may be at different levels from each other.

Each of the 1A semiconductor chip 12A, the 1B semiconductor chip 12B, the 2A semiconductor chip 14A, and the 2B semiconductor chip 14B may be connected to the second chip pad 24, the second bonding wire 34, the second bonding pad 114, the second internal wiring 124, the connection pad 116, and the connector 130 and thus may be electrically connected to an external device.

The connector 130 electrically connected to the second chip pad 24 of each of the 1A semiconductor chip 12A, the 1B semiconductor chip 12B, the 2A semiconductor chip 14A, and the 2B semiconductor chip 14B may be adjacent to each of the first to fourth edges 100-1 to 100-4 of the semiconductor package substrate 100. Accordingly, average paths of the second internal wirings 124 that are electrically connected to the 1A semiconductor chip 12A, the 1B semiconductor chip 12B, the 2A semiconductor chip 14A, and the 2B semiconductor chip 14B, respectively, may be similar to each other.

Figure 5A:
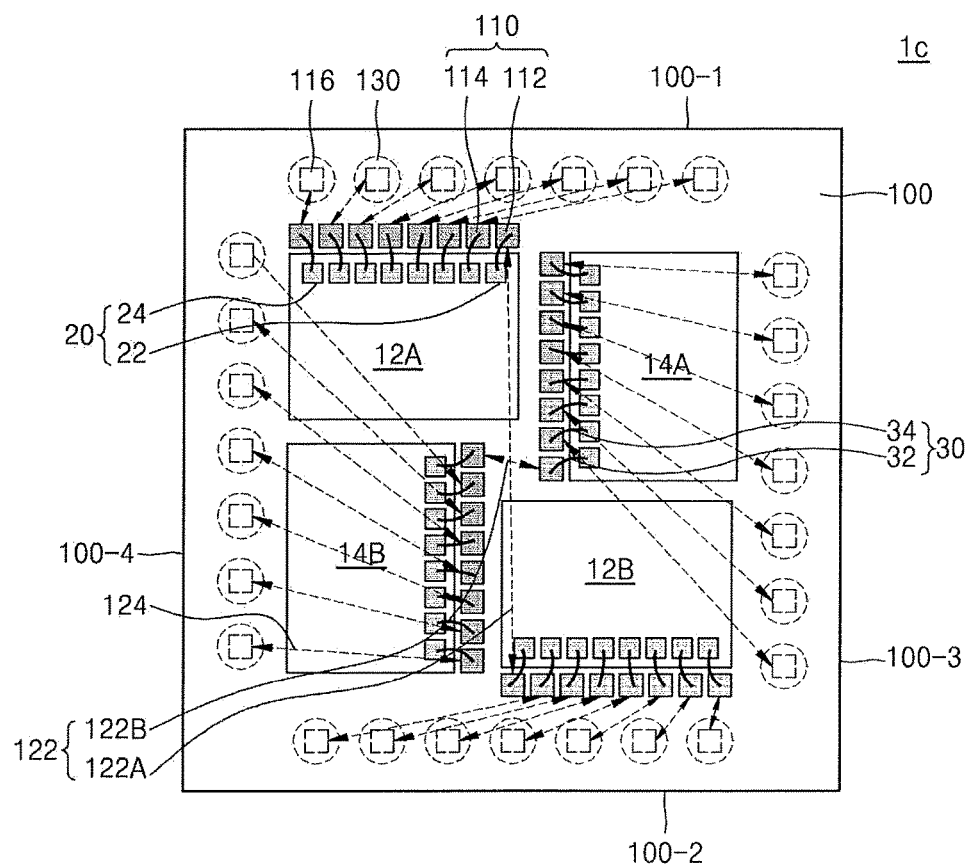
FIGS. 5A to 5C illustrate plan views of a semiconductor package according to an embodiment.
Figure 5B:
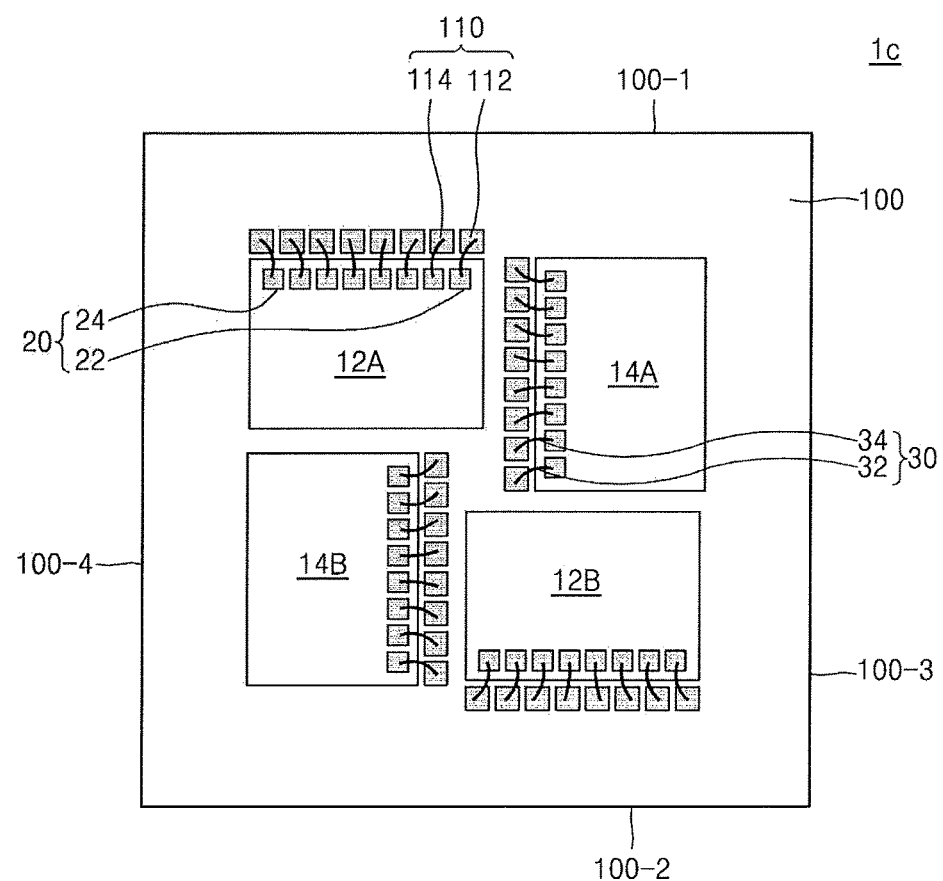
Figure 5C:
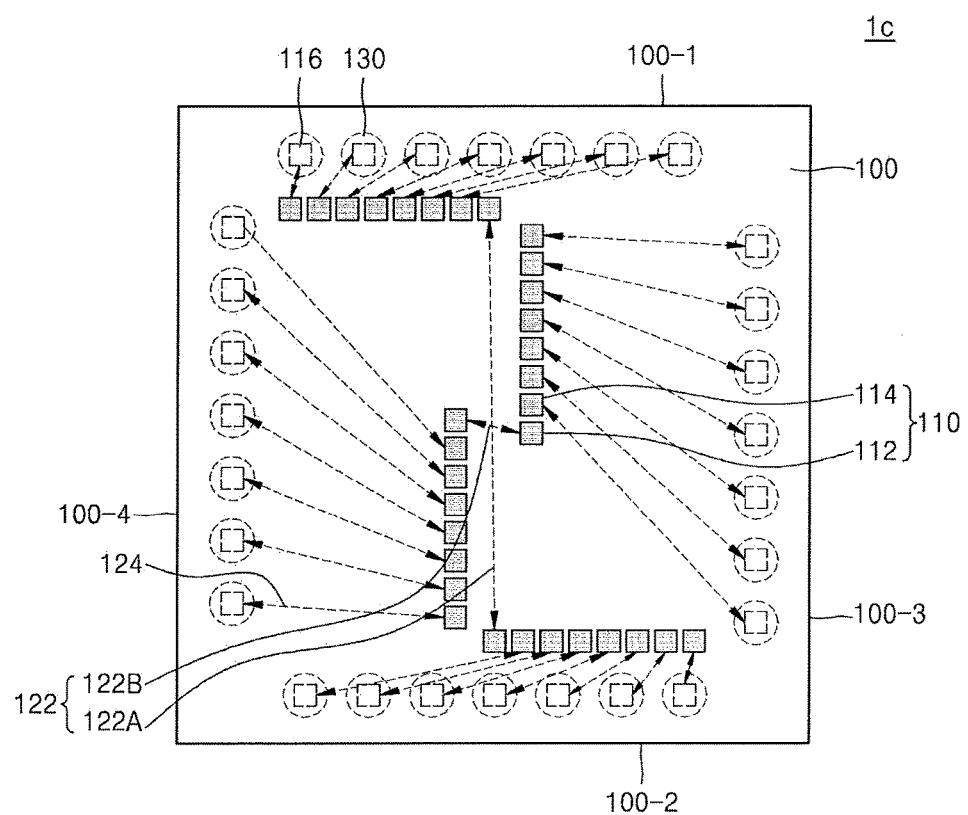

FIGS. 5A to 5C are plan views of a semiconductor package 1c according to an embodiment. FIG. 5B is a plan view illustrating arrangement of semiconductor chips included in the semiconductor package, and FIG. 5C is a plan view illustrating a bonding pad of a package base substrate included in the semiconductor package and connection relationship between a connector attached to the package base substrate and the bonding pad. In further detail, each of FIGS. 5B and 5C is a plan view selectively illustrating some elements of FIG. 5A. FIG. 5B is a plan view illustrating arrangement of the semiconductor chips 12A, 12B, 14A, and 14B included in the semiconductor package 1c, and FIG. 5C is a plan view illustrating the bonding pad 110 of the package base substrate 100 included in the semiconductor package 1c and connection relationship between the connector 130 attached to the package base substrate 100 and the bonding pad 110. A description that has been made with reference to FIGS. 1 to 4C may be omitted.

Referring to FIGS. 5A to 5C together, the semiconductor package 1c includes the package base substrate 100 and the semiconductor chips 12A, 12B, 14A, and 14B. The semiconductor chips 12A, 12B, 14A, and 14B may have the first semiconductor chips 12A and 12B paired together and the second semiconductor chips 14A and 14B paired together. Thus, the first semiconductor chips 12A and 12B may have the 1A semiconductor chip 12A and the 1B semiconductor chip 12B paired together, and the second semiconductor chips 14A and 14B may have the 2A semiconductor chip 14A and the 2B semiconductor chip 14B paired together. The semiconductor chips 12A, 12B, 14A, and 14B may be, for example, memory semiconductor chips.

Each of the semiconductor chips 12A, 12B, 14A, and 14B may have the chip pads 20 that are adjacent to an edge (for example, a first edge) of the top surface (which is an active surface) of each of the semiconductor chips 12A, 12B, 14A, and 14B.

The package base substrate 100 may include the bonding pad 110 and the connection pad 116 respectively on an upper surface and a lower surface of the package base substrate 100. The connector 130 may be attached onto the connection pad 116 on the lower surface of the package base substrate 100.

The bonding wire 30 may electrically connect the chip pad 20 and the bonding pad 110 that correspond to each other to each other.

The chip pad 20 may include the first chip pad 22 and the second chip pad 24. For example, at least one of the chip pads 20 that one of the semiconductor chips 12A, 12B, 14A, and 14B has may be the first chip pad 22, and the other may be the second chip pad 24. The bonding pad 110 may include the first bonding pad 112 and the second bonding pad 114. For example, at least one of the bonding pads 110 electrically connected to the chip pads 20 that one of the semiconductor chips 12A, 12B, 14A, and 14B has may be the first bonding pad 112, and the other may be the second bonding pad 114.

The bonding wire 30 may include the first bonding wire 32 that connects the first chip pad 22 and the first bonding pad 112 and the second bonding wire 34 that connects the second chip pad 24 and the second bonding pad 114.

Although it is illustrated that the chip pads 20 are arranged in a row along the first edge, in other implementations the chip pads 20 may be arranged, for example, in two or more rows along the first edge.

Although it is illustrated that the first chip pad 22 is at an end of the row formed by the chip pads 20, in other implementations the first chip pad 22 may be, for example, in the middle of the row formed by the chip pads 20.

The semiconductor chips 12A, 12B, 14A, and 14B may be disposed on the package base substrate 100 such that first edges of the semiconductor chips 12A, 12B, 14A, and 14B respectively face edges of the package base substrate 100 that are different from each other.

The 1A semiconductor chip 12A and the 1B semiconductor chip 12B may be disposed on the package base substrate 100 such that the first edges of the 1A semiconductor chip 12A and the 1B semiconductor chip 12B respectively face edges of the package base substrate 100 that are opposite each other. The 1A semiconductor chip 12A and the 1B semiconductor chip 12B may be disposed on the package base substrate 100 such that the first edges of the 1A semiconductor chip 12A and the 1B semiconductor chip 12B are respectively adjacent to edges of the package base substrate 100 that are different from each other.

The 2A semiconductor chip 14A and the 2B semiconductor chip 14B may be disposed on the package base substrate 100 such that the first edges of the 2A semiconductor chip 14A and the 2B semiconductor chip 14B respectively face edges of the package base substrate 100 that are opposite each other. The 2A semiconductor chip 14A and the 2B semiconductor chip 14B may be disposed on the package base substrate 100 such that second edges opposite to the first edges of the 2A semiconductor chip 14A and the 2B semiconductor chip 14B are respectively adjacent to edges of the package base substrate 100 that are opposite each other.

For example, the 1A semiconductor chip 12A and the 1B semiconductor chip 12B may be disposed on the package base substrate 100 such that the first edges of the 1A semiconductor chip 12A and the 1B semiconductor chip 12B face the first edge 100-1 and the second edge 100-2 of the package base substrate 100, respectively, and the 2A semiconductor chip 14A and the 2B semiconductor chip 14B may be disposed on the package base substrate 100 such that the first edges of the 2A semiconductor chip 14A and the 2B semiconductor chip 14B face the fourth edge 100-4 and the third edge 100-3 of the package base substrate 100, respectively.

The bonding pad 110 connected to the chip pad 20 of each of the semiconductor chips 12A, 12B, 14A, and 14B may be adjacent to the first edge of each of the semiconductor chips 12A, 12B, 14A, and 14B.

For example, the bonding pad 110 connected to the chip pad 20 of the 1A semiconductor chip 12A may be adjacent to the first edge 100-1 of the package base substrate 100. The bonding pad 110 connected to the chip pad 20 of the 1B semiconductor chip 12B may be adjacent to the second edge 100-2 of the package base substrate 100. The bonding pad 110 connected to the chip pad 20 of the 2A semiconductor chip 14A may be between the 2A semiconductor chip 14A and the 1A semiconductor chip 12A. The bonding pad 110 connected to the chip pad 20 of the 2B semiconductor chip 14B may be between the 2B semiconductor chip 14B and the 1B semiconductor chip 12B.

Accordingly, a loop path of the bonding wire 30 that connects the chip pad 20 and the bonding pad 110 to each other may be shortened.

The internal wirings 122 and 124 disposed in the package base substrate 100 may include the first internal wiring 122 and the second internal wiring 124.

The first internal wiring 122 may be connected to the first bonding pad 112 connected to the first chip pad 22 of each of the semiconductor chips 12A, 12B, 14A, and 14B via the first bonding wire 32. The first internal wiring 122 may include the 1A internal wiring 122A and the 1B internal wiring 122B. For example, the 1A internal wiring 122A may connect the first bonding pads 112 that are respectively connected to the first chip pads 22 of the 1A semiconductor chip 12A and the 1B semiconductor chip 12B via the first bonding wire 32 to each other, and the 1B internal wiring 122B may connect the first bonding pads 112 that are respectively connected to the first chip pads 22 of the 2A semiconductor chip 14A and the 2B semiconductor chip 14B via the first bonding wire 32 to each other.

The 1A semiconductor chip 12A and the 1B semiconductor chip 12B may be connected to each other via the 1A internal wiring 122A so as to serve as one semiconductor chip. Also, the 2A semiconductor chip 14A and the 2B semiconductor chip 14B may be connected to each other via the 1B internal wiring 122B so as to serve as one semiconductor chip.

For example, the second chip pad 24 may be a DQ pad or a CA pad of each of the semiconductor chips 12A, 12B, 14A, and 14B. For example, the first chip pad 22 may be a pad for matching ZQ calibration between the 1A semiconductor chip 12A and the 1B semiconductor chip 12B or between the 2A semiconductor chip 14A and the 2B semiconductor chip 14B. Thus, the 1A semiconductor chip 12A and the 1B semiconductor chip 12B or the 2A semiconductor chip 14A and the 2B semiconductor chip 14B may have ZQ calibration matched through the 1A internal wiring 122A or the 1B internal wiring 122B and thus may serve as one semiconductor chip.

The 1A internal wiring 122A and the 1B internal wiring 122B may be separate from each other in the package base substrate 100 and may not be connected to the connector 130, that is, the connection pad 116.

As illustrated in FIGS. 3A and 3B, the 1A internal wiring 122A and the 1B internal wiring 122B may be at the same level as each other or may be at different levels from each other.

Each of the 1A semiconductor chip 12A, the 1B semiconductor chip 12B, the 2A semiconductor chip 14A, and the 2B semiconductor chip 14B may be connected to the second chip pad 24, the second bonding wire 34, the second bonding pad 114, the second internal wiring 124, the connection pad 116, and the connector 130 and thus may be electrically connected to an external device.

The connector 130 electrically connected to the second chip pad 24 of each of the 1A semiconductor chip 12A, the 1B semiconductor chip 12B, the 2A semiconductor chip 14A, and the 2B semiconductor chip 14B may be adjacent to each of the first to fourth edges 100-1 to 100-4 of the semiconductor package substrate 100. Accordingly, the second internal wiring 124 electrically connected to the 1A semiconductor chip 12A and the 1B semiconductor chip 12B and the second internal wiring 124 electrically connected to the 2A semiconductor chip 14A and the 2B semiconductor chip 14B may be further from the first to fourth edges 100-1 to 100-4 of the semiconductor package substrate 100 than the connectors 130 are. Accordingly, even when the connectors 130 are arranged in two or more rows along the first to fourth edges 100-1 to 100-4 of the package base substrate 100 or are arranged over the lower surface of the package base substrate 100, design and placement of the second internal wiring 124 may be easy.

Figure 6A:
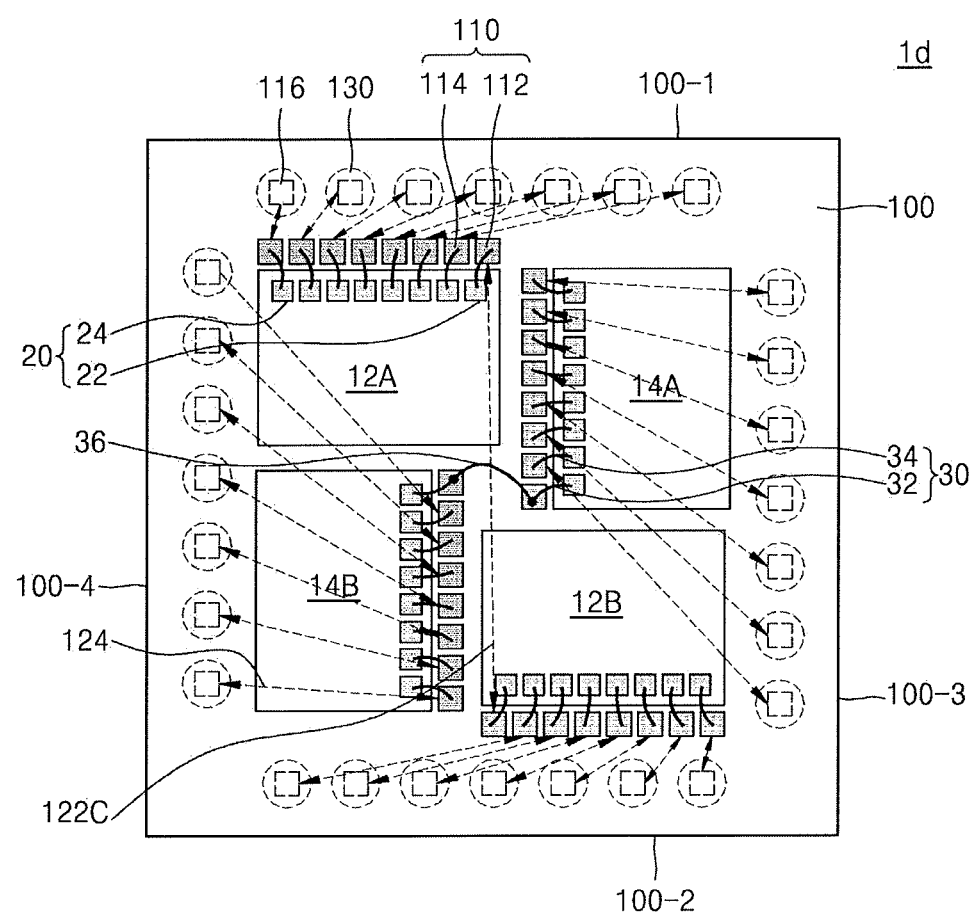
FIGS. 6A to 6C illustrate plan views of a semiconductor package according to an embodiment.
Figure 6B:
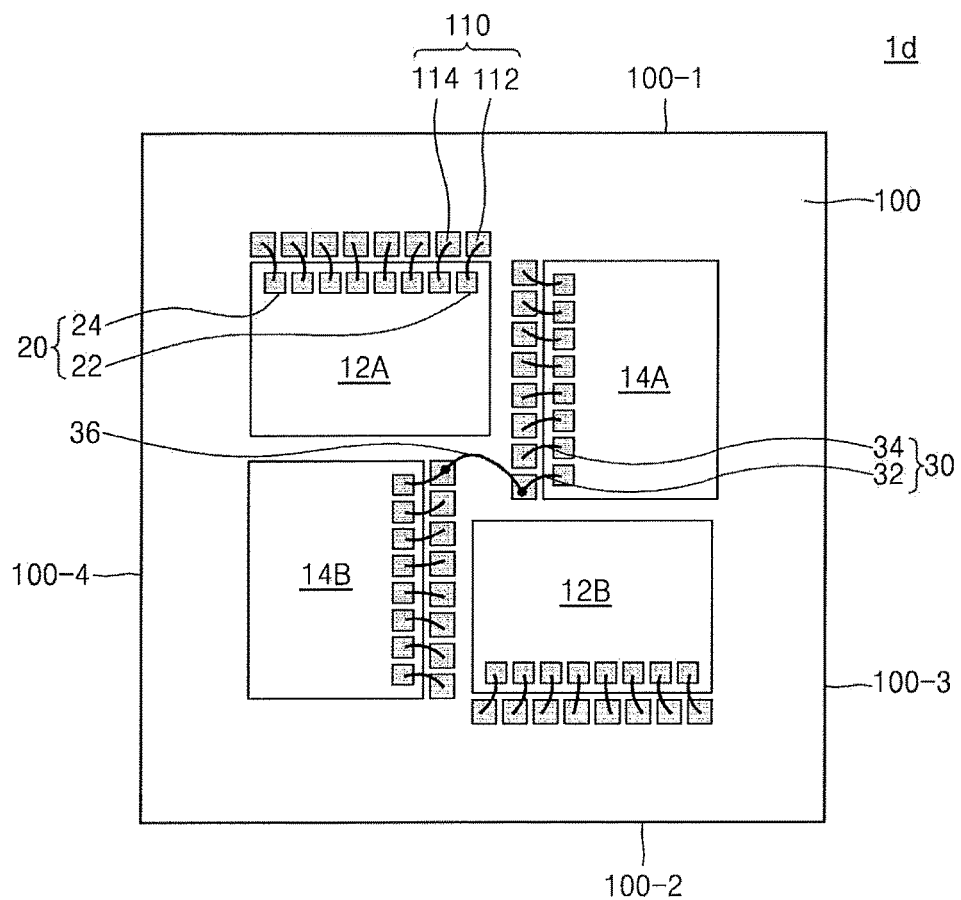
Figure 6C:
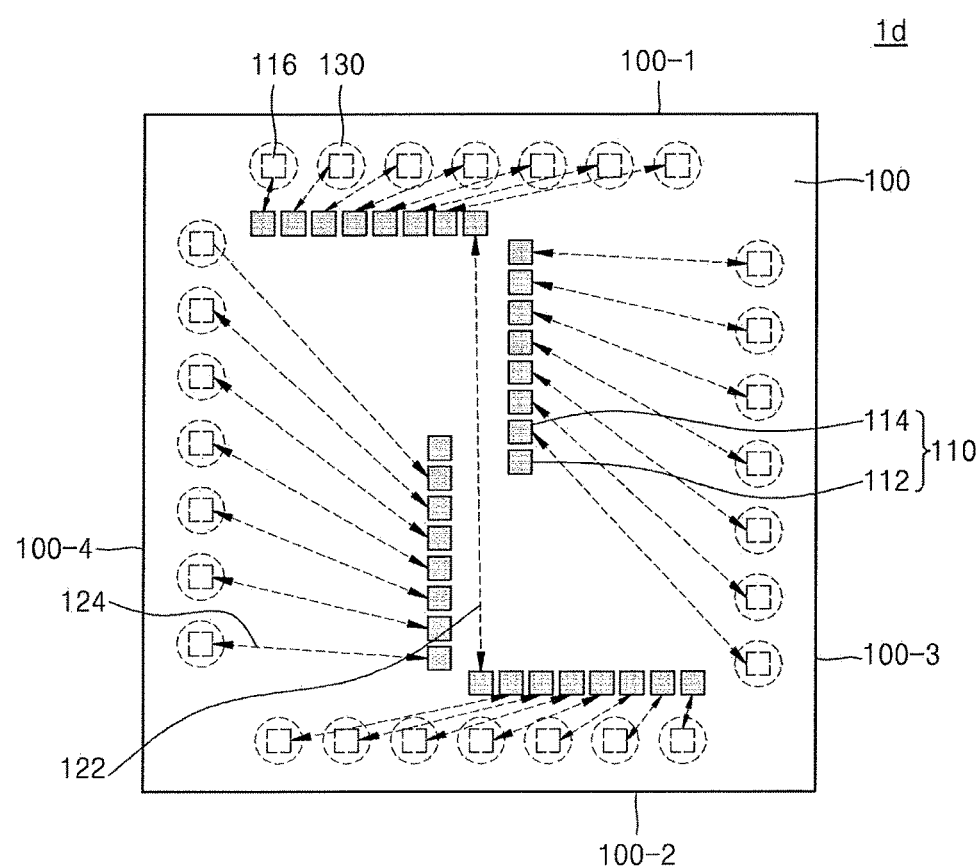

FIGS. 6A to 6C are plan views of a semiconductor package 1*d* according to an embodiment. FIG. 6B is a plan view illustrating arrangement of semiconductor chips included in the semiconductor package, and FIG. 6C is a plan view illustrating a bonding pad of a package base substrate included in the semiconductor package and connection relationship between a connector attached to the package base substrate and the bonding pad. In further detail, each of FIGS. 6B and 6C is a plan view selectively illustrating some elements of FIG. 6A. FIG. 6B is a plan view illustrating arrangement of the semiconductor chips 12A, 12B, 14A, and 14B included in the semiconductor package 1*d*, and FIG. 6C is a plan view illustrating the bonding pad 110 of the package base substrate 100 included in the semiconductor package 1*d* and connection relationship between the connector 130 attached to the package base substrate 100 and the bonding pad 110.

Since the semiconductor package 1*d* of FIGS. 6A to 6C is mostly the same as the semiconductor package 1*c* of FIGS. 5A to 5C except that the semiconductor package 1*d* includes a first internal wiring 122C and a connection bonding wire 36 instead of the 1A and 1B internal wirings 122A and 122B of the semiconductor package 1*c*, differences with FIGS. 5A to 5C will be mainly described.

Referring to FIGS. 6A to 6C, the semiconductor package 1*d* includes the package base substrate 100 and the semiconductor chips 12A, 12B, 14A, and 14B. Also, the semiconductor package 1*d* includes the first internal wiring 122C and the connection bonding wire 36.

The first internal wiring 122C may connect the first bonding pads 112 that are respectively connected to the first chip pads 22 of the 1A semiconductor chip 12A and the 1B semiconductor chip 12B via the first bonding wire 32 to each other. The connection bonding wire 36 may connect the first bonding pads 112 that are respectively connected to the first chip pads 22 of the 2A semiconductor chip 14A and the 2B semiconductor chip 14B via the first bonding wire 32 to each other.

Thus, the first bonding pads 112 that are respectively connected to the 1A semiconductor chip 12A and the 1B semiconductor chip 12B and are relatively far from each other may be connected to each other via the first internal wiring 122C disposed in the package base substrate 100, and the first bonding pads 112 that are respectively connected to the 2A semiconductor chip 14A and the 2B semiconductor chip 14B and are relatively close to each other may be connected to each other via the connection bonding wire 36 extending onto the package base substrate 100. Accordingly, internal wirings 122C and 124 in the package base substrate 100 may become relatively simpler, and thus, interference between the internal wirings 122C and 124 may decrease, thereby increasing reliability and performance of the semiconductor package 1*d*.

The first internal wiring 122C or the connection bonding wire 36 for matching ZQ calibration between the 1A semiconductor chip 12A and the 1B semiconductor chip 12B or between the 2A semiconductor chip 14A and the 2B semiconductor chip 14B may be referred to as a matching wiring.

Figure 7:
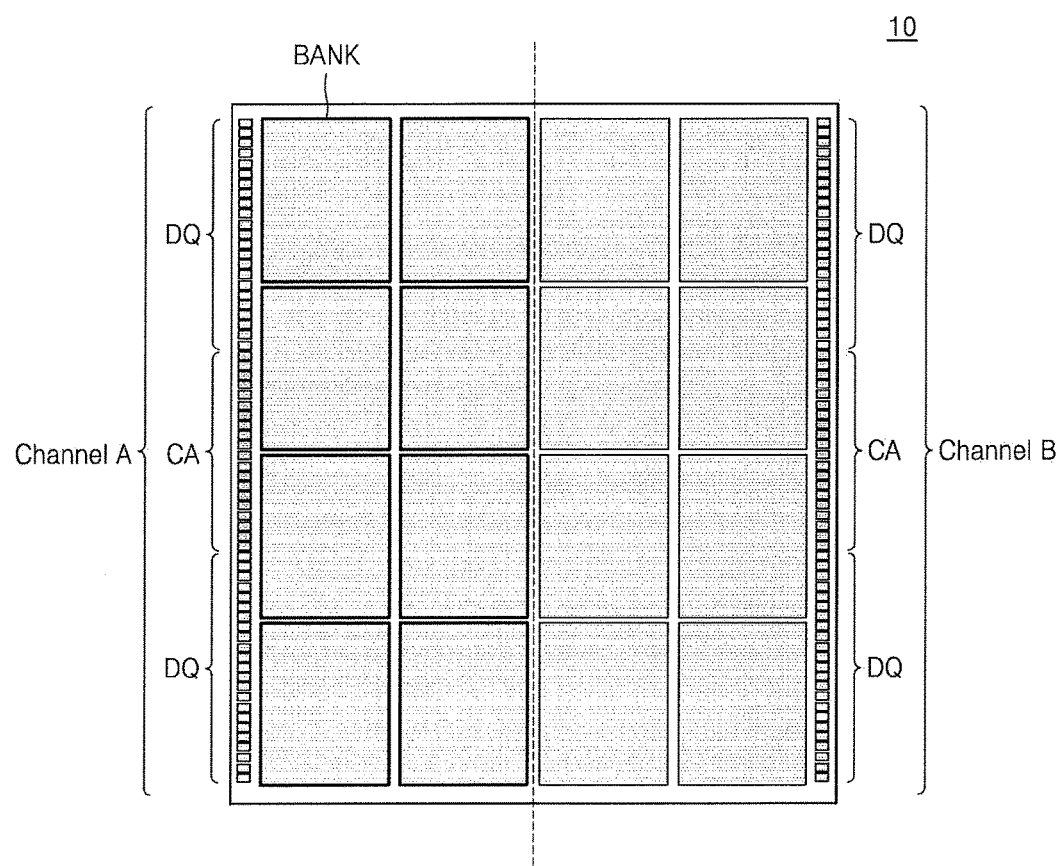
FIG. 7 illustrates a chip layout for describing semiconductor chips included in a semiconductor package according to an embodiment.

FIG. 7 is a chip layout for describing semiconductor chips 10 included in a semiconductor package according to an embodiment.

Referring to FIG. 7, a semiconductor chip 10 may have two independent channels, that is, channel A and channel B.

The channel A and the channel B may each have a DQ pad and a CA pad. For example, the semiconductor chip 10 may have the channel A and the channel B that are two independent channels each having 16 DQ pads.

Also, the channel A and the channel B may each have a bank. For example, a bank marked with a thick border line may be a bank that the channel A has, and a bank marked with a thin border line may be a bank that the channel B has.

Referring to FIGS. 1 to 7 together, channel A portion of the semiconductor chip 10 of FIG. 7 may correspond to the semiconductor chip A 10A of FIG. 1. Channel B portion of the semiconductor chip 10 of FIG. 7 may correspond to the semiconductor chip B 10B of FIG. 1.

Similarly, the channel A portion of the semiconductor chip 10 of FIG. 7 may correspond to the 1A semiconductor chip 12A or the 2A semiconductor chip 14A of FIGS. 2A to 2C and FIGS. 4A to 6C, and the channel B portion of the semiconductor chip 10 of FIG. 7 may correspond to the 1B semiconductor chip 12B or the 2B semiconductor chip 14B of FIGS. 2A to 2C and FIGS. 4A to 6C.

The semiconductor chip 10 according to the present embodiment may have the channel A portion and the channel B portion not formed as one semiconductor chip but separate, as the two semiconductor chips 10A and 10B. The channel A portion and the channel B portion may be connected to each other via the matching wiring such as the first internal wiring 122 and serving as one semiconductor chip.

For example, the semiconductor chip 10 may have the semiconductor chip A 10A and the semiconductor chip B 10B connected to each other via the first internal wiring 122 and both satisfying JESD209-4, which is the JEDEC Standard regarding LPDDR4. However, a semiconductor chip included in a semiconductor package according to one or more embodiments is not limited thereto. When a semiconductor chip that has independent channels, the number of which is a multiple of 2, is separate as two, and the two separate semiconductor chips serve as one semiconductor chip, the semiconductor chip may be the one included in a semiconductor package according to one or more embodiments.

Figure 8:
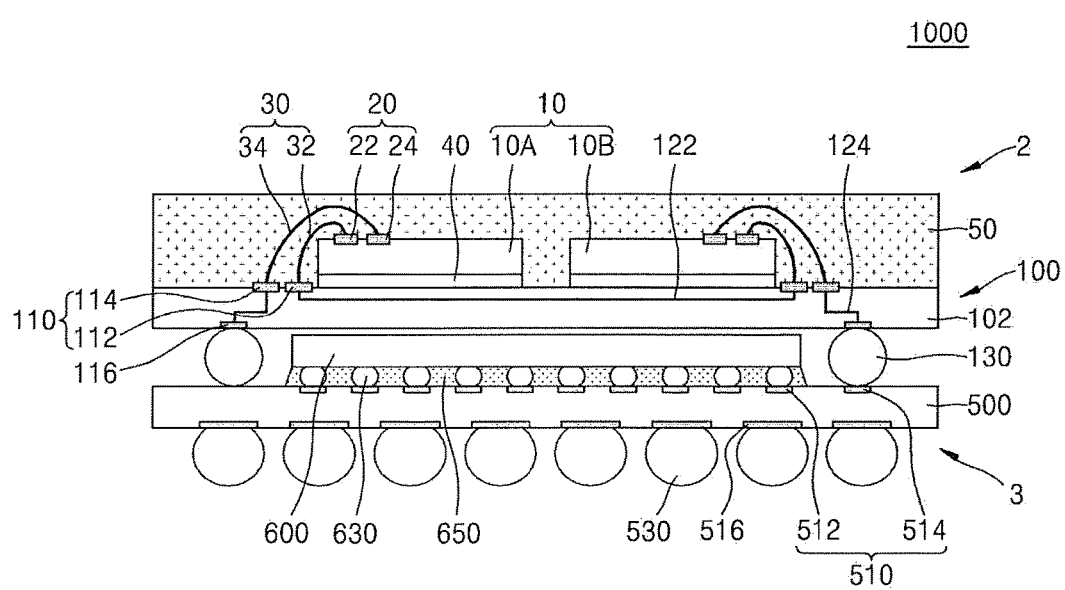
FIG. 8 illustrates a cross-sectional view of a semiconductor package according to an embodiment.

FIG. 8 is a cross-sectional view of a semiconductor package 1000 according to an embodiment.

Referring to FIG. 8, the semiconductor package 1000 may have a package-on-package (PoP) structure including a main package 3 (which includes a main semiconductor chip 600 attached onto a main package base substrate 500) and a sub-package 2 (which is attached onto the main package 3).

Since the sub-package 2 has the same configuration as the semiconductor package 1 of FIG. 1, a detailed description thereof will be omitted.

The main package 3 includes the main package base substrate 500 and the main semiconductor chip 600 attached onto the main package base substrate 500.

Since the main package base substrate 500 has a similar structure to the package base substrate 100 of FIG. 1, a detailed description thereof will be omitted.

The main package base substrate 500 may include an upper pad 510 and a lower pad 516 respectively on an upper surface and a lower surface of the main package base substrate 500. The upper pad 510 may include a first upper pad 512 and a second upper pad 514. The upper pad 510 and the lower pad 516 may be exposed via a solder resist layer (not shown). An external connector 530 may be attached to the lower surface of the main package base substrate 500. The external connector 530 may be attached, for example, onto the lower pad 516. The external connector 530 may electrically connect the semiconductor package 1000 and an external device to each other.

The main semiconductor chip 600 may be a processor unit. The main semiconductor chip 600 may be, for example, an application processor (AP), a micro processor unit (MPU), or a graphic processor unit (GPU). The main semiconductor chip 600 may be electrically connected to the first upper pad 512 via a connection bumper 630. The main semiconductor chip 600 may be attached onto the main package base substrate 500 as a flip chip such that an active surface of the main semiconductor chip 600 faces the main package base substrate 500.

The sub-package 2 may be electrically connected to the second upper pad 514 via the connector 130. Thus, the connector 130 may be connected to the second upper pad 514 on the upper surface of the main package base substrate 500.

In some embodiments, an under-fill layer 650 may be between the main semiconductor chip 600 and the main package base substrate 500. Also, a main mold layer (not shown) may be between the main package base substrate 500 and the package base substrate 100. In some embodiments, the under-fill layer 650 may be a portion of the main mold layer, which is formed using, for example, molded under-fill (MUF). When the main mold layer is formed, a hole that exposes the second upper pad 514 may be formed in the main mold layer to electrically connect the connector 130 and the second upper pad 514 to each other.

As having been described with reference to FIGS. 1 to 7, the sub-package 2 may be thinly formed. Accordingly, the semiconductor package 1000 that includes the sub-package 2 may have thickness decreased.

Figure 9:
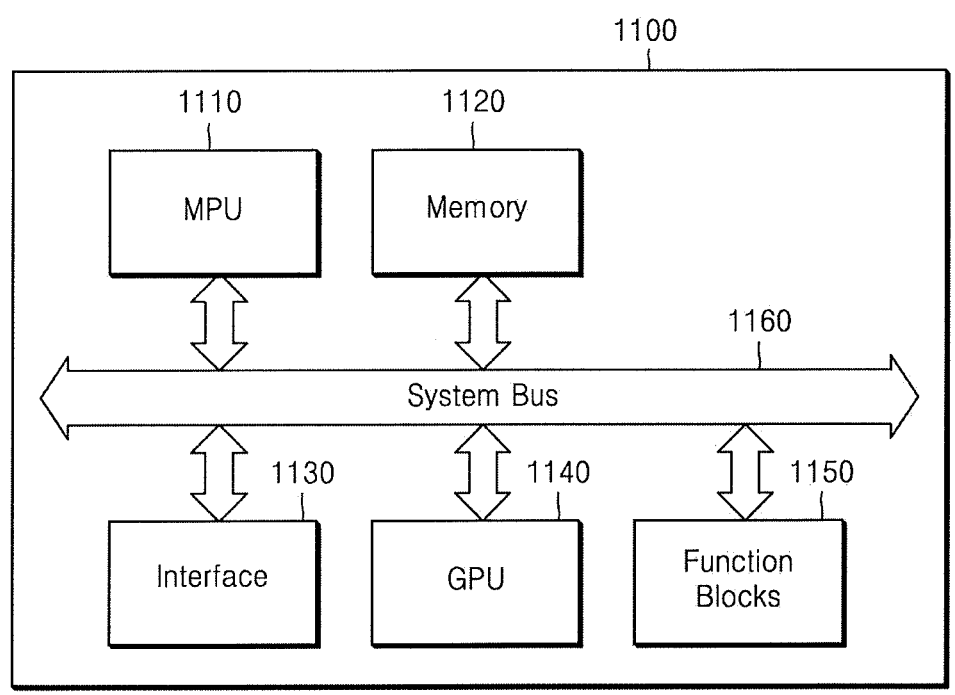
FIG. 9 schematically illustrates a structure of a semiconductor package according to an embodiment.

FIG. 9 schematically illustrates a structure of a semiconductor package 1100 according to an embodiment.

Referring to FIG. 9, the semiconductor package 1100 may include an MPU 1110, a memory 1120, an interface 1130, a GPU 1140, functional blocks 1150, and a bus 1160 via which these components are connected to one another. The semiconductor package 1100 may include both the MPU 1110 and the GPU 1140 or may include either the MPU 1110 or the GPU 1140.

The MPU 1110 may include a core and an L2 cache. For example, the MPU 1110 may include multi-cores. Performances of the multi-cores may be the same as or different from each other. The multi-cores may be activated at the same time or at different points of time. The memory 1120 may store results of processes performed in the function blocks 1150, under the control of the MPU 1110. For example, as the contents stored in the L2 cache of the MPU 1110 is flushed, the memory 1120 may store the results of processes that are performed in the function blocks 1150. The interface 1130 may interface with external devices. For example, the interface 1130 may interface with a camera, a liquid crystal display (LCD), a speaker, or the like.

The GPU 1140 may perform graphic functions. For example, the GPU 1140 may perform video codec or process three-dimensional (3D) graphics.

The function blocks 1150 may perform various functions. For example, when the semiconductor package 1100 is an AP for use in mobile devices, some of the function blocks 1150 may perform a communication function.

The memory 1120 may correspond to at least one of the semiconductor packages 1, 1a, 1b, 1c, and 1d of FIGS. 1 to 7. The semiconductor package 1100 may include at least one of the semiconductor packages 1, 1a, 1b, 1c, and 1d of FIGS. 1 to 7. In an implementation, the semiconductor package 1100 may be the semiconductor package 1000 of FIG. 8.

The semiconductor package 1100 may have thickness decreased, and thus, an electronic device that includes the semiconductor package 1100 may be thin and light.

Figure 10:
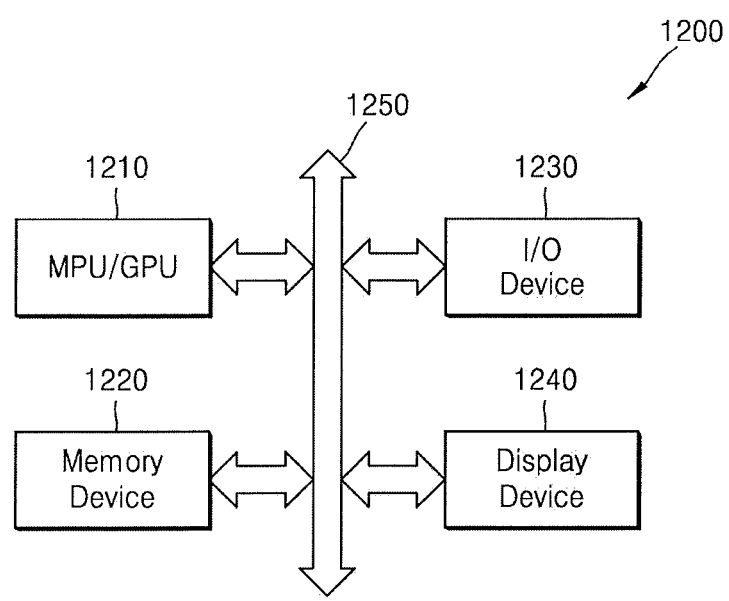
FIG. 10 illustrates an electronic system including a semiconductor package according to an embodiment.

FIG. 10 illustrates an electronic system 1200 including a semiconductor package according to an embodiment.

Referring to FIG. 10, the electronic system 1200 may include an MPU/GPU 1210. The electronic system 1200 may be, for example, a mobile device, a desktop computer, or a server. Also, the electronic system 1200 may further include a memory device 1220, an input/output (I/O) device 1230, and a display device 1240, each of which may be electrically connected to a bus 1250.

The memory device 1220 may correspond to at least one of the semiconductor packages 1, 1a, 1b, 1c, and 1d of FIGS. 1 to 7. The MPU/GPU 1210 and the memory device 1220 may include at least one of the semiconductor packages 1, 1a, 1b, 1c, and 1d of FIGS. 1 to 7 or may be the semiconductor package 1000 of FIG. 8.

The electronic system 1200 may include the MPU/GPU 1210 and the memory device 1220 that have thickness decreased, internal wirings simplified, or length decreased. Thus, the electronic system 1200 may be thinner and lighter and may also have increased reliability.

Figure 11:
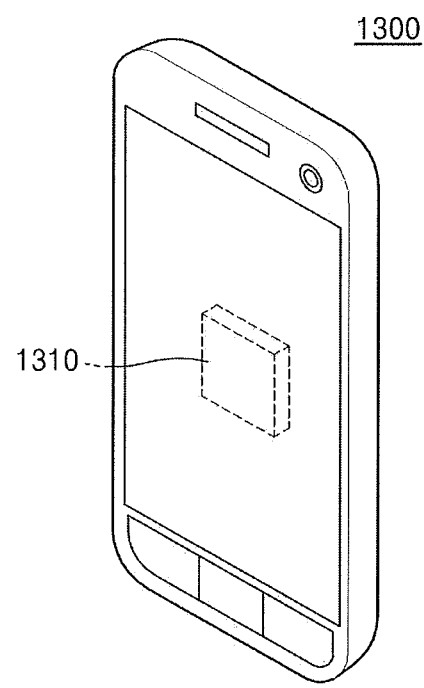
FIG. 11 illustrates a schematic perspective view of an electronic device to which a semiconductor package according to an embodiment is applied.

FIG. 11 is a schematic perspective view of an electronic device to which a semiconductor package according to an embodiment is applied.

FIG. 11 illustrates an example in which the electronic system 1200 of FIG. 10 is applied to a mobile phone 1300. The mobile phone 1300 may include a semiconductor package 1310. The semiconductor package 1310 may be each of the semiconductor packages 1, 1a, 1b, 1c, 1d, and 1000 of FIGS. 1 to 8.

The mobile phone 1300 may include the semiconductor package 1310 that may have thickness decreased, internal wirings simplified, or length decreased and may be thinner and lighter. Thus, the mobile phone 1300 may have a smaller size and high performance.

In addition, the electronic system 1200 may be used in, for example, a portable laptop, an MP3 player, navigation, a solid state disk (SSD), a motor vehicle, or a household appliance.

By way of summation and review, as mobile devices are expected to provide excellent performance and high capacity, a semiconductor package included in a mobile device is expected to have excellent performance and high capacity. However, when semiconductor chips are stacked for providing high capacity, height of the semiconductor package increases, and defects may occur during a process of forming a bonding wire.

As described above, a semiconductor chip (for example, low power double data rate 4 (LPDDR4) that has 2 ch) that performs one function is separated as a pair of semiconductor chips and attached on a printed circuit board (PCB), and thus, height of a semiconductor package may decrease, and processes may be performed easily. Also, two pairs of semiconductor chips, that is, four semiconductor chips, are attached on the PCB (for example, while each is rotated by 90 degrees from another) and thus, characteristics of the semiconductor package may improve. In an implementation, the four semiconductor chips may be identical to one another, and may be respectively disposed on the substrate (for example, while rotated 90 degrees relative to one another, e.g., in an clock wise or counter clock wise sequence such that the semiconductor package has four point rotational symmetry relative to the four semiconductor chips).

In addition, the semiconductor package according to one or more embodiments includes a wiring that connects only a pair of semiconductor chips to each other so that the pair of semiconductor chips operate as a semiconductor chip that performs one function.

Embodiments may provide a semiconductor package that may provide high capacity and may also be thin to obtain an electronic device, such as a mobile device, that has a small size, light weight, and high capacity.

According to one or more embodiments, a semiconductor package may have thickness decreased and defects prevented during a process of forming a bonding wire by using a pair of semiconductor chips serving as one semiconductor chip. Also, an internal wiring in a package base substrate may become simpler or may have decreased length, and thus, there may be no degradation in characteristics of the semiconductor package. Accordingly, the semiconductor package may have increased reliability.

Thus, an electronic device that includes the semiconductor package according to one or more embodiments may have a smaller size, lighter weight, and higher capacity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package base substrate including bonding pads and a connection pads respectively on an upper surface and a lower surface of the package base substrate;
four semiconductor chips attached onto the package base substrate, including a 1A semiconductor chip, a 1B semiconductor chip, a 2A semiconductor chip, and a 2B semiconductor chip, and each including a plurality of chip pads that are adjacent to a first edge of an upper surface of each of the 1A semiconductor chip, the 1B semiconductor chip, the 2A semiconductor chip, and the 2B semiconductor chip; and
a bonding wire disposed above the upper surface of the package base substrate, the bonding wire electrically connecting the chip pad and the bonding pad to each other, wherein the four semiconductor chips are disposed on the package base substrate such that first edges of the four semiconductor chips respectively face edges of the package base substrate that are different from each other, wherein:
the 1A semiconductor chip and the 1B semiconductor chip are semiconductor chips of the same type,
the 2A semiconductor chip and the 2B semiconductor chip are semiconductor chips of the same type, and
the semiconductor package further comprises:
a first matching wire connecting the 1A semiconductor chip and the 1B semiconductor chip to each other and a second matching wire connecting the 2A semiconductor chip and the 2B semiconductor chip to each other, wherein:
a first semiconductor chip including the 1A semiconductor chip and the 1B semiconductor chip and a second semiconductor chip including the 2A semiconductor chip and the 2B semiconductor chip serve as one semiconductor chip due to the first matching wiring and the second matching wiring, respectively,
the 1A semiconductor chip and the 1B semiconductor chip have ZQ calibration matched through the first matching wire, and
the 2A semiconductor chip and the 2B semiconductor chip have ZQ calibration matched through the second matching wire.

2. The semiconductor package as claimed in claim 1, wherein the 1A semiconductor chip and the 1B semiconductor chip are disposed on the package base substrate such that first edges of the 1A semiconductor chip and the 1B semiconductor chip respectively face edges of the package base substrate that face each other.

3. The semiconductor package as claimed in claim 1, wherein each of the first matching wiring and the second matching wiring is an internal wiring in the package base substrate.

4. The semiconductor package as claimed in claim 1, wherein the first matching wiring is an internal wiring in the package base substrate, and the second matching wiring is a connection bonding wire extending onto the package base substrate.

5. The semiconductor package as claimed in claim 1, wherein at least one selected from the chip pads of each of the 1A semiconductor chip and the 1B semiconductor chip is electrically connected to the first matching wiring, and the others are electrically connected to the connection pads, and
at least one selected from the chip pads of each of the 2A semiconductor chip and the 2B semiconductor chip is electrically connected to the second matching wiring, and the others are electrically connected to the connection pads.

6. The semiconductor package as claimed in claim 2, wherein the 1A semiconductor chip and the 1B semiconductor chip are disposed on the package base substrate such that the first edges of the 1A semiconductor chip and the 1B semiconductor chip are respectively adjacent to the edges of the package base substrate that face each other.

7. The semiconductor package as claimed in claim 2, wherein the four semiconductor chips are disposed on the package base substrate such that second edges opposite to first edges of the four semiconductor chips are respectively adjacent to edges of the package base substrate that are different from each other.

8. The semiconductor package as claimed in claim 6, wherein the 2A semiconductor chip and the 2B semiconductor chip are disposed on the package base substrate such that first edges of the 2A semiconductor chip and the 2B semiconductor chip are respectively adjacent to edges of the package base substrate that face each other.

9. The semiconductor package as claimed in claim 3, wherein the first matching wiring and the second matching wiring extend at the same level as each other in the package base substrate while not crossing each other.

10. The semiconductor package as claimed in claim 3, wherein the first matching wiring and the second matching wiring extend at different levels from each other in the package base substrate and cross each other in a vertical direction with respect to a main surface of the package base substrate.

11. A semiconductor package, comprising:
a package base substrate including a plurality of bonding pads and a plurality of connection pads respectively on an upper surface and a lower surface of the package base substrate, a first matching wiring and a second matching wiring in the package base substrate, and four edges;

four semiconductor chips including a 1A semiconductor chip and a 1B semiconductor chip that are electrically connected to each other via the first matching wiring and a 2A semiconductor chip and a 2B semiconductor chip that are electrically connected to each other via the second matching wiring, each including a plurality of chip pads that are adjacent to a first edge of an upper surface of each of the 1A semiconductor chip, the 1B semiconductor chip, the 2A semiconductor chip, and the 2B semiconductor chip, and attached on the upper surface of the package base substrate;

a bonding wire disposed above the upper surface of the package base substrate, the bonding wire electrically connecting each of the chip pads and each of the bonding pads to each other; and a connector attached on each of the connection pads, wherein:

the four semiconductor chips including the 1A semiconductor chip, the 1B semiconductor chip, the 2A semiconductor chip, and the 2B semiconductor chip are disposed on the package base substrate such that first edges of the four semiconductor chips respectively face the four edges of the package base substrate different from each other, the 1A semiconductor chip and the 1B semiconductor chip are semiconductor chips of the same type, the 2A semiconductor chip and the 2B semiconductor chip are semiconductor chips of the same type, the 1A semiconductor chip and the 1B semiconductor chip have ZQ calibration matched through the first matching wire, and the 2A semiconductor chip and the 2B semiconductor chip have ZQ calibration matched through the second matching wire.

12. The semiconductor package as claimed in claim 11, wherein the first matching wiring and the second matching wiring are electrically insulated from the connection pads in the package base substrate, at least one selected from the chip pads of each of the 1A semiconductor chip and the 1B semiconductor chip is electrically connected to the first matching wiring, and the others are electrically connected to the connection pads, respectively, and at least one selected from the chip pads of each of the 2A semiconductor chip and the 2B semiconductor chip is electrically connected to the second matching wiring, and the others are electrically connected to the connection pads, respectively.

13. The semiconductor package as claimed in claim 11, further comprising:

a main package base substrate;

a main semiconductor chip attached onto the main package base substrate; and a main external connector attached onto a lower surface of the main package base substrate, wherein the connector is connected to an upper surface of the main package base substrate, such that the package base substrate on which the four semiconductor chips are attached is attached on the main package base substrate on which the main semiconductor chip is attached to have a package-on-package structure.

14. The semiconductor package as claimed in claim 13, wherein the four semiconductor chips are memory semiconductor chips, and the main semiconductor chip is a processor unit.

* * * * *